United States Patent
Wood et al.

(10) Patent No.: US 8,629,807 B2
(45) Date of Patent: Jan. 14, 2014

(54) TRUE TIME DELAY PHASE ARRAY RADAR USING ROTARY CLOCKS AND ELECTRONIC DELAY LINES

(75) Inventors: John Wood, Santa Cruz, CA (US); Haris Basit, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 1044 days.

(21) Appl. No.: 11/913,377

(22) PCT Filed: Jun. 6, 2006
(Under 37 CFR 1.47)

(86) PCT No.: PCT/US2006/021989
§ 371 (c)(1),
(2), (4) Date: Dec. 27, 2010

(87) PCT Pub. No.: WO2006/133225
PCT Pub. Date: Dec. 14, 2006

(65) Prior Publication Data
US 2012/0039366 A1   Feb. 16, 2012

Related U.S. Application Data

(60) Provisional application No. 60/688,169, filed on Jun. 6, 2005, provisional application No. 60/730,915, filed on Oct. 26, 2005.

(51) Int. Cl.
*H01Q 3/22* (2006.01)
*H01Q 3/00* (2006.01)
*H01Q 3/02* (2006.01)

(52) U.S. Cl.
USPC ............................. 342/375; 342/372; 342/374

(58) Field of Classification Search
USPC .................. 342/368, 372, 374, 375; 327/261; 331/55
See application file for complete search history.

(56) References Cited

U.S. PATENT DOCUMENTS

| 5,083,130 A | 1/1992 | Cardiasmenos |
| 5,990,830 A | 11/1999 | Vail |

(Continued)

FOREIGN PATENT DOCUMENTS

| EP | 0 646 982 A1 | 4/1995 |
| EP | 0646982 A1 | 4/1995 |

(Continued)

OTHER PUBLICATIONS

"Rotary Traveling-Wave Oscillator Arrays: A New Clock Technology" IEEE Journal of Solid-State Circuits, IEEE Service Center, Piscataway, NJ, US, vol. 36, No. 11, Nov. 1, 2001, XP011106t639, Wood et al.

(Continued)

*Primary Examiner* — Dao Phan
(74) *Attorney, Agent, or Firm* — Knobbe Martens Olson & Bear LLP

(57) ABSTRACT

Local oscillator circuitry for an antenna array is disclosed. The circuitry includes an array of rotary traveling wave oscillators which are arranged in a pattern over an area and coupled so as to make them coherent. This provides for a set of phase synchronous local oscillators distributed over a large area. The array also includes a plurality of phase shifters each of which is connected to one of the rotary oscillators to provide a phase shifted local oscillator for the array. The phase shifter optionally includes a cycle counter that is configured to count cycles of the rotary oscillator to which it is connected and control circuitry that is then operative to provide a shifted rotary oscillator output based on the count from the cycle counter.

20 Claims, 28 Drawing Sheets

(56) References Cited

U.S. PATENT DOCUMENTS

| | | |
|---|---|---|
| 6,005,515 A | 12/1999 | Allen |
| 2002/0033768 A1 | 3/2002 | Neeman |
| 2004/0087294 A1 | 5/2004 | Wang |
| 2004/0246176 A1 | 12/2004 | Mohamadi |

FOREIGN PATENT DOCUMENTS

| | | |
|---|---|---|
| GB | 2 250 134 | 5/1992 |
| GB | 2250134 A | 5/1992 |
| WO | WO 2006/133225 | 12/2006 |

OTHER PUBLICATIONS

Written Opinion PCT/US06/21989 Apr. 4, 2007.
ISR PCT/US06/21989 Apr. 4, 2007.
International Search Report and Written Opinion of the International Searching Authority in PCT/US2006/21989, dated Apr. 4, 2007, 8 pages.
Wood, John et al., *Rotary Traveling-Wave Oscillator Arrays: A New Clock Technology*, IEEE Journal of Solid-State Circuits, IEEE Service Center, vol. 36, No. 11, Nov. 1, 2001.

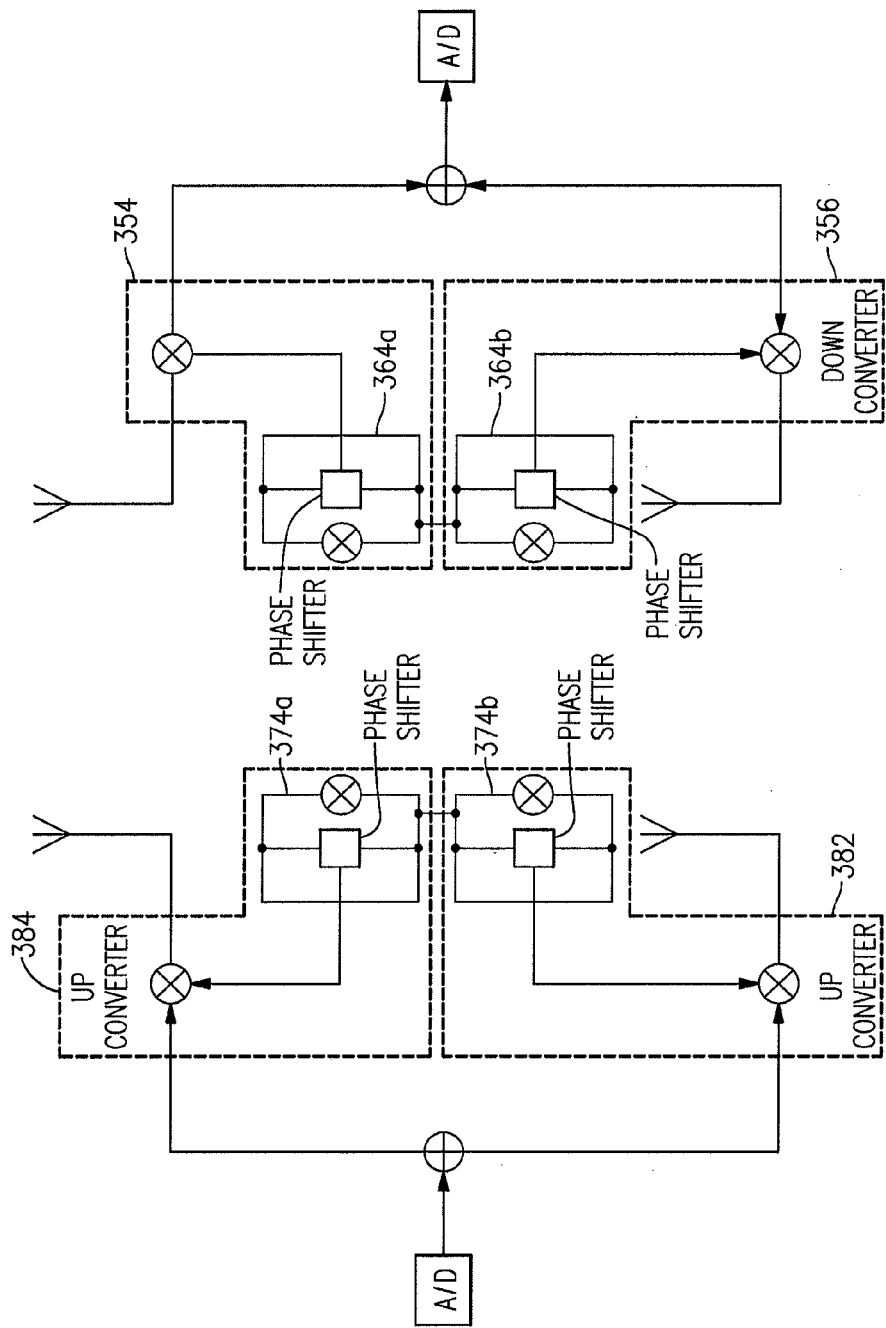

TRUE TIME DELAY PHASE ARRAY RADAR USING ROTARY CLOCKS AND ELECTRONIC DELAY LINES

CROSS-REFERENCE TO RELATED APPLICATIONS

This application claims priority to U.S. Provisional Application Ser. No. 60/688,169, filed Jun. 6, 2005, titled "PHASED ARRAY ANTENNA SYSTEMS USING ROTARY TRAVELING WAVE OSCILLATORS," which is incorporated by reference into the instant application and priority to U.S. Provisional Application Ser. No. 60/730,915, filed Oct. 26, 2005, and titled "TRUE TIME DELAY PHASE ARRAY RADAR USING ROTARY CLOCKS AND ELECTRONIC DELAY LINES", which is incorporated by reference into the instant application.

FIELD OF THE INVENTION

The present invention relates generally to broadband phased array antenna systems and more particularly to true-time broadband phase array antenna systems.

DESCRIPTION OF THE RELATED ART

Antenna arrays are well-known and operate according to the general principle that the far field of an array of identical elements is the product 10 of the electric field pattern of a single element 12 considered as a point source at a reference point and the array factor 14, as shown in FIG. 1. Each antenna array has its own array factor 14, AF, which depends on the number of elements, the physical arrangement including the spacing between elements, and the magnitude and phase of the drive to each element. The geometry of a regular planar array 16 is shown in FIG. 2. In the figure, M is the total number of elements in the x direction, N is the total number of elements in the y direction. Assuming that each element is a small dipole (a dipole with a length much shorter than the wavelength), the far field pattern of an element is $E_{far} \cong E_k \exp(-jkr)$, where $E_k$ is the magnitude of the element excitation (in the medium of propagation), r is the distance from the dipole (which is much greater than the wavelength), k is the wavenumber in the medium at the frequency of operation, and $\theta$ is a far field viewing angle to the observation point. If each element in a planar array has a separation distance $d=d_x$, $d_y$ (assuming the distances are the same in each direction), then the distance to the far field observation point is different for each element. A distance $d \sin\theta \cos\phi$ must be subtracted for each element not at the origin (assuming the origin is set at the far corner of the array) to account for the differences in distances from each element to the observation point. Thus, for the M elements placed along or parallel to the x-axis, the sum of the fields is $$E_{far,x} \cong \sum_{m=1}^{M} E_m \exp(-jk(r-(m-1)d\sin\theta\cos\phi)).$$

The sum of the fields for the N element along or parallel to the y-axis $$E_{far,y} \cong \sum_{n=1}^{N} E_n \exp(-jk(r-(n-1)d\sin\theta\cos\phi)).$$

Factoring out the far field dipole element pattern, $\exp(-jkr)$, and adding a phase parameter for each element, leaves, $$S_{xm} = \sum_{m=1}^{M} E_m \exp(j(m-1)kd\sin\theta\cos\phi + \beta_{mx})$$

for the x-axis element geometry and $$S_{yn} = \sum_{n=1}^{N} \exp(j(n-1)kd\cos\phi\sin\theta + \beta_{ny})$$

for the y-axis element geometry. Because each element in the y-direction can be considered a linear array of elements in the x-direction, the geometry factors must be multiplied to give the geometry factor (array factor) for a planar array, i.e., $AF = S_{xm} S_{yn}$.

From this it is clear that the array factor determines the observation angles $\theta_0$, $\phi_0$, at which the elements of the array constructively interfere with each other. According to the equations, the observation points at which constructive interference occurs is determined solely by the wave number (which is usually fixed for a particular antenna) and the differences in distances. Adjusting the constructive interference patterns by means of the element distances is generally limited. If the distances between elements are equal or greater than the wavelength, then undesirable grating lobes are formed, and the array is not usable in some applications. To avoid this, the spacing between the elements in the x and y directions is typically set to be less than the wavelength of operation, preferably, ½ to ¼ of a wavelength. This distance and the number of elements of course determine the physical size of the array. For example, at 10 GHz, ¼ of a wavelength is ¾ cm, and with 400 elements in both the x and y directions, the array size is about 9 m².

To gain more control over the array, an arbitrary phase parameter $\beta_{mn}$ for each element is introduced into the array factor by the feed or receiving system. This arbitrary phase can be the same or different for every element of the array. These parameters alter the array factor in such a way as to produce constructive interference at any desired observation point, thus permitting the inter-element distances to be set at the preferred spacing. Furthermore, it is easily seen that the principle point of constructive interference (the main beam) can be placed or moved to almost any angle, $\theta_0$, $\phi_0$, by the proper choices of the phase parameters $\beta_{mn}$. Not only can the beam be moved, but complex beam patterns can be formed, including multiple beams and nulls in beams.

Another parameter that is useful for controlling the beam of an array is the magnitude the signal value for each element $E_{mn}$. If this value is different for each element, even more control by the feed or receiver system over the array is possible.

It is thus desirable to construct an improved phased array antenna by using coherent clocking source in the feed or receiving system in which the magnitude and phase of each antenna element and the cycle or cycles during which each element is activated can be carefully controlled Phase-array radar have a unique ability to perform electronic beam-steering of the outgoing and incoming pulses and pick out targets and regions of interest. As suggested by the name, phase-array antenna is a combination (linear or X/Y array) of individual cooperating smaller antenna elements. Its output and reception sensitivity can be steered electronically usually by adjusting the operating phase of the individual elements relative to each other.

On transmit, a pulse wavefront can be directed angularly by having some elements lead others in time (or phase) to steer the EM-pulse.

Typically, on receive, a LNA is followed by programmable delay elements or programmable-phase mixers, the outputs of which are summed. The idea is that only the radar reflections arriving from the wavefront angle corresponding to the electronically set delays/phases will sum additively, while energy arriving on the array from other directions will tend to sum to zero because of the phase mismatch at the summer.

The notion of equivalence of phase-array versus time-delay only applies to narrowband radar where the transmit frequency is well-defined. This assumption no longer holds in broadband radar systems where the wideband, modulated pulses have energy corresponding to many different frequency components. It can be shown that the beam for a phased array can be moved by changing the frequency at which the array operates. When a phased array is operated in pulse mode, a band of frequencies is present and each spectral component of the pulse has a slightly different beam direction. This lowers the performance of the antenna system when used in pulse mode. In fact, the overall antenna gain of the pulse is less than that of a single spectral component which has maximum gain in the desired direction. Under these circumstances it is better to use a true-time-delay system rather than a phase-delay system since the desired effect of the electronics is really to compensate for time differences on the wavefront which apply over all frequencies. (Space and the antenna are intrinsically broadband and time-domain). The use of time delays rather than phase delays results in a beam in space that is stationary and independent of frequency when operated in pulse mode.

One approach used previously for phase-array antenna synchronization has been the use of cooperating injection-locked LC tank oscillators to form an X/Y plane of sinusoidal excitation over large physical extent. These signal can be used locally at each element to drive the up- and down-conversion mixers. The beam can be 'steered' by simply de-tuning the LC tanks on the sides of the array to 'pull' the phase of the array making a phase-gradient over the array. For example, adding varactors at the left and right sides on an linear array allows it to be steered left/right if the control voltages on the left and right-side varactors are different +,−/−,+ respectively.

A fundamental difference between phase-delay and true-time delay radar lies in the ability of the latter to provide information storage in its signal processing path and not just phased power-combination. The difference applies mainly with broadband operation, the limit of which might be reception of a single pulse arriving at a radar sub-array of physical extent greater than one wavelength. An example of this situation will be given later.

Only a true-time-delay radar with variable-delay signal storage medium can correctly capture and combine the energy from all of its elements in the broadband case. A simple phased-array antenna array (which just alters the relative phase of the receiver channels before power combination) fails to combine the power of the single-pulse if the aperture of the antenna sub-array is greater than one pulse wavelength long (it can only combine power accurately from elements within some fraction of a cycle of each other—i.e., some phase offset from each other).

BRIEF SUMMARY OF THE INVENTION

The present invention is directed to maintaining phase coherence across radiating elements spanning large distances and distributing synchronized signals to each antenna element.

One embodiment of the present invention is a local oscillator system for a phased array antenna. The local oscillator system includes a plurality of rotary traveling wave oscillators and a plurality of phase shifters. The oscillators are arranged in a pattern over an area and coupled so as to make them coherent. The plurality of phase shifters each provides a local oscillator signal with a selected phase for a phased array antenna. Each phase shifter is located proximate to one of the rotary oscillators and is connected to a plurality of phase taps of the proximate oscillator. Each phase shifter receives control information to select one of the phase taps for output as the local oscillator signal. Additionally, and optionally, each phase shifter includes a cycle counter for counting clock cycles of the proximate oscillator and the system includes synchronization logic for initializing the cycle counters simultaneously. The phase shifter selects one of the phase taps as the local oscillator signal based on the cycle counter so as to provide the local oscillator signal at the selected phase for one or more counts of the cycle counter.

Another embodiment of the present invention is a phased array antenna system that includes a plurality of antenna elements, a plurality of down-converters, a signal combining network, a rotary oscillator array and a control unit. The plurality of antenna elements is arranged in a pattern, for receiving radio-frequency signals. The plurality of down-converters is each connected to one of the antenna elements to receive the radio-frequency signal captured by the antenna element and each down converter is operative to down-convert the received radio-frequency signal using a local oscillator signal having a selected phase. The signal combining network is operative to combine the down-converted signals generated by the down-converters to produce an output signal. The rotary oscillator array is configured to provide local oscillator signals each with a selected phase to each of the down-converters based on control information. The control unit is configured to provide control information to the rotary oscillator array to obtain the phase-shifted local oscillator signals.

Yet another embodiment of the present invention is a phased array antenna system that includes a plurality of antenna elements, a plurality of up-converters, a signal distribution network, a rotary oscillator array, and a control unit. The plurality of antenna elements is arranged in a pattern, for sending radio-frequency signals. The plurality of up-converters is each connected to one of the antenna elements to send a radio-frequency signal, and each up-converter is operative to up-convert the an input signal to a radio-frequency signal using a local oscillator signal having a selected phase. The signal distribution network is operative to distribute the input signals to the up-converters. The rotary oscillator array is configured to provide local oscillator signals each with a selected phase to each of the up-converters based on control information. The control unit is configured to provide control information to the rotary oscillator array to obtain the phase-shifted local oscillator signals.

Yet another embodiment of the present invention is a method of providing a plurality of local oscillator signals for a phased array. The method includes (i) providing a plurality of rotary traveling wave oscillators, arranged in a pattern over an area, (ii) coupling the oscillators so as to make them coherent, (iii) locating each of a plurality of phase shifters proximate to one of the rotary oscillators, (iv) connecting the phase shifter to a plurality of phase taps of the proximate oscillator, and (v) receiving control information to select one of the phase taps for output as a local oscillator signal for the phased array.

In another embodiment of the above method, the each phase shifter includes a cycle counter that counts cycles of the proximate oscillator and the method includes, prior to receiving control information to select one of the phase taps, synchronizing the cycle counters in each of the phase shifters, and receiving control information to enable the local oscillator signal as an output for one or more cycles of the cycle counter. The step of synchronizing the cycle counters includes (i) transmitting a reset signal through a total number of pipeline stages disposed over the area, (ii) delaying the reset signal provided at a particular stage an amount in clock cycles equal to the difference between the total number of stages and the delay at the particular stage, and (iii) using each delayed signal to reset one of the counters.

One advantage of the present invention is that beams for an antenna array can be precisely formed because a plurality of phases is available over a large area from an array of rotary oscillators. The invention thus supports selection of arbitrary phase at each antenna element allowing for very complex beam patterns, including multiple beams and beams with nulls.

Another advantage is that a beam can be easily and quickly moved to a new azimuth and elevation by selecting among the available phases and cycle counts from an array of rotary oscillators.

Yet another advantage is that an antenna element can be operative in the array for a large number of clock cycles while the local oscillator used by that element maintains a precise phase shift.

Yet another embodiment of the present invention is an antenna element circuit for providing a true time delay. The antenna element circuit includes an rf port for sending or receiving rf signals, an antenna element port for connecting to an antenna element, a transmit path, a receive path, a local multiphase oscillator, and a pair of switches. The transmit path is the path through which a signal to be transmitted travels to an antenna element and includes an analog delay line for time delaying an if signal on the rf port in response to transmit delay line timing signals, a S/H circuit connected to the analog delay line for adding a fractional delay to the delayed rf signal in response to a transmit sample and hold timing signal, and a power amplifier for boosting the signal from the S/H circuit and for driving the antenna element. The receive path is the path through which a received signal travels from an antenna element and includes a low noise amplifier for boosting the received signal, a S/H circuit, connected to the low noise amplifier, for adding a fractional delay to the received signal in response to a receive sample and hold timing signal, and an analog delay line for time delaying the signal from the S/H circuit in response to receive delay line timing signals. The local multiphase oscillator is operative to supply the transmit and receive delay line timing signals and the transmit and receive sample and hold timing signals. The pair of switches is operative to selectably coupling either the transmit path or receive path between the rf port and the antenna element.

Yet still another embodiment of the present invention is a phased array antenna system that includes a plurality of antenna elements, a plurality of transceiver blocks, a distribution and collection network, and a controller. Each of the plurality of transceiver blocks is connected to one of the antenna elements and to an rf port and each transceiver block includes a transmit path through which a signal to be transmitted travels to the connected antenna element, where the transmit path includes a true time delay of the signal to be transmitted, a receive path through which a received signal travels from the connected antenna element, where the receive path includes a true time delay of the signal received, a local multiphase oscillator for supply timing signals to the transmit and receive paths, and a pair of switches for selectably coupling either the transmit path or the receive path between the rf port and the connected antenna element. The distribution and collection network is connected to the transceiver block and is operative to distribute the rf signals to be transmitted and to collect the rf signals received. The controller is operative to provide digital control signals to the transceiver blocks.

In the new approach described here, a fully-electronic, mostly-digital, 100% true-time-delay array is proposed and has no narrowband limit.

BRIEF DESCRIPTION OF THE DRAWINGS

These and other features, aspects and advantages of the present invention will become better understood with regard to the following description, appended claims, and accompanying drawings where:

FIG. 16A shows a transmitter arrangement with a pair of rotary oscillators;

FIG. 16B shows a receiver arrangement with a pair of rotary oscillators;

FIG. 19 has a timing diagram showing the phase-select settings for the S/H and the CCD tap settings that achieves the correct true-time power combination;

DETAILED DESCRIPTION OF THE INVENTION

Figure 3A:
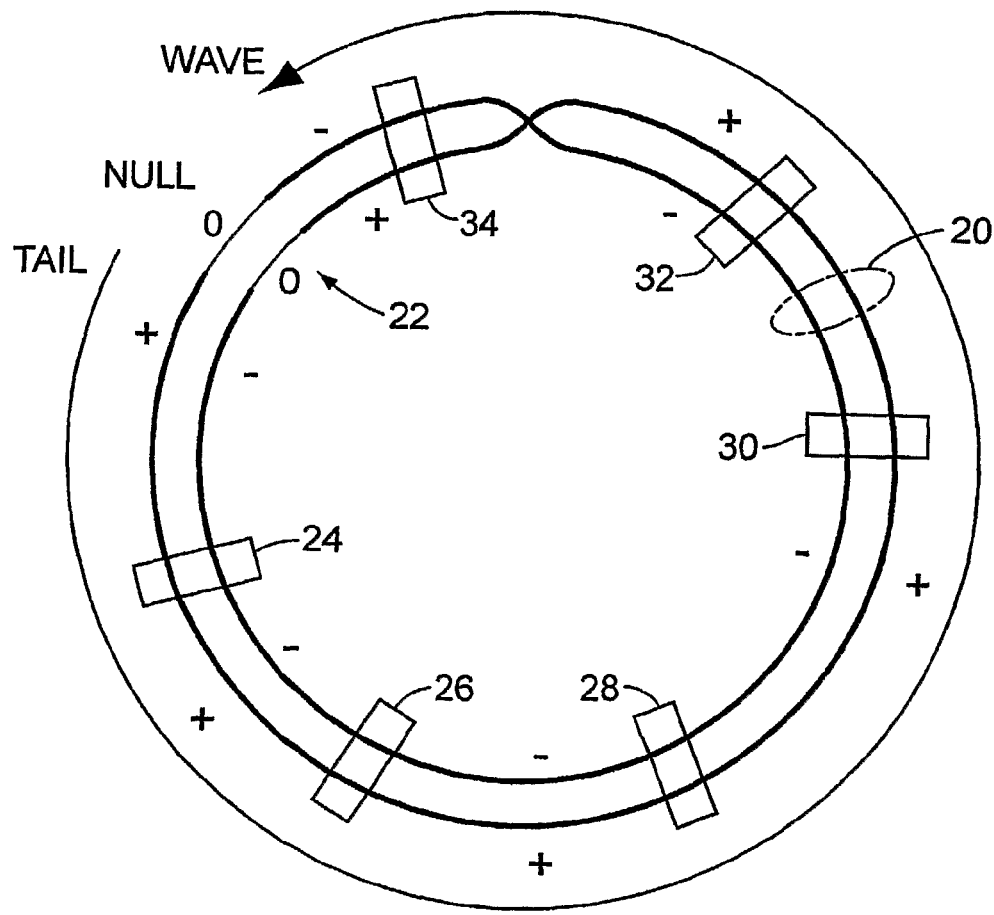
FIG. 3A shows a rotary clock in a circular configuration with a single cross-over.

FIG. 3A shows a rotary clock in a circular configuration with a single cross-over. As described in an earlier patent, U.S. Pat. No. 6,556,089, assigned to the same assignee, Multigig, LTD, the rotary clock oscillator operates by causing a wave to travel around the loop, reversing its phase at the crossover. Two traverses of the loop are required to complete an oscillation. The null point, shown in the figure, which is the wavefront of the phase reversal, is created by the crossover and actually travels around the loop at a specific speed, which is discussed further below. Regeneration devices 24-34, connected between the conductors of the differential signal path carrying the traveling wave, are placed around the loop at spaced apart intervals and provide the energy to initiate and maintain the propagation of the wave. The loop 20 can have any shape and physical size, as long as the loop is closed. More than one crossover can be used, as long as the number is odd to guarantee an odd number of phase reversals in each traverse of the loop, a prerequisite to maintaining oscillation throughout the loop. Practically any phase of the oscillation is available from the loop by simply connecting a tap to the loop at the proper physical location. Very little energy is needed to sustain the oscillation because the only losses are the resistive losses in the conductors of the signal path of the loop. Jitter of the rotary oscillator is very low, thus making it very suitable for use in applications that require precision phase control.

Figure 1:
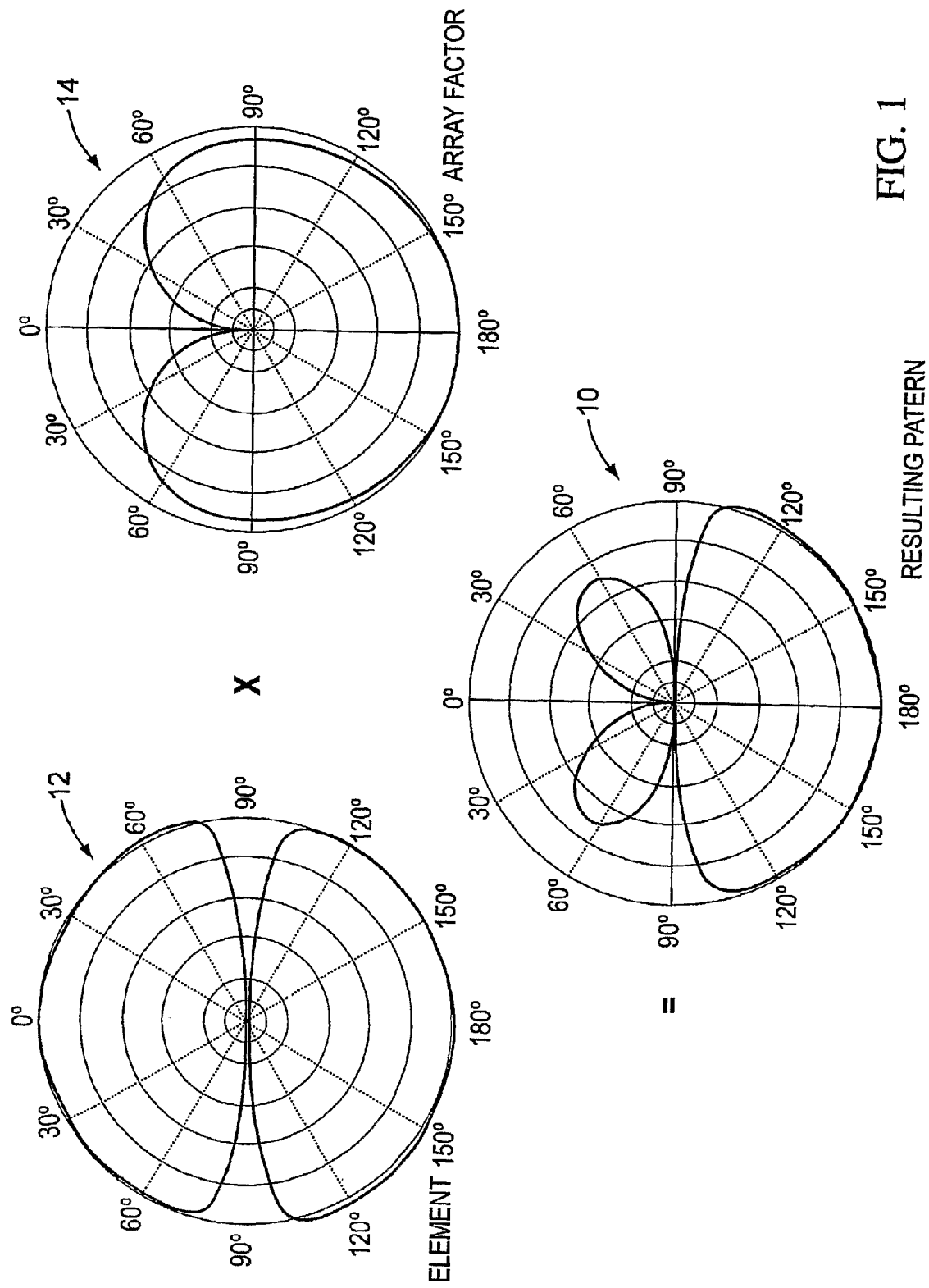
FIG. 1 shows a beam pattern of an array element, an array factor and the resulting pattern of an array.
Figure 2:
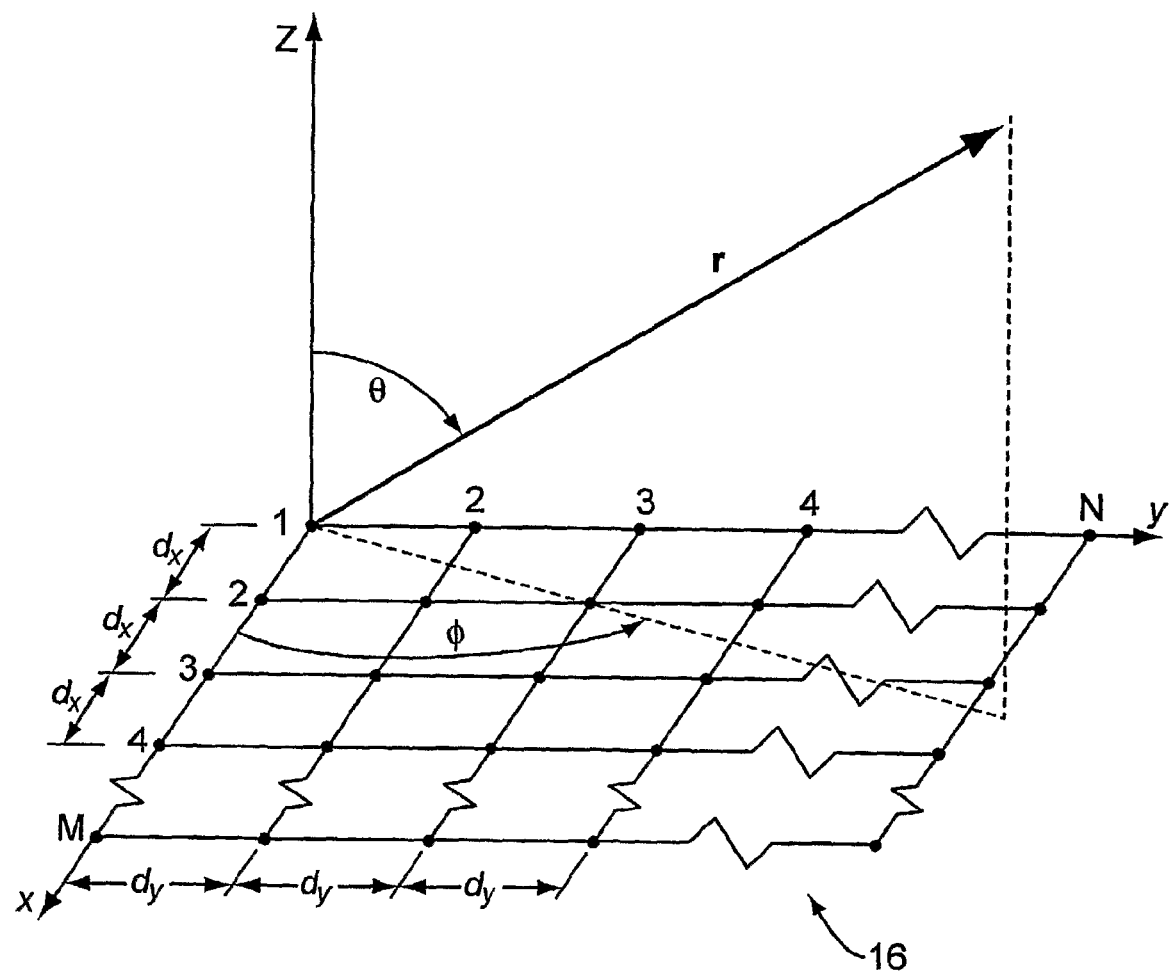
FIG. 2 shows the geometry of a planar array of antenna elements.
Figure 3B:
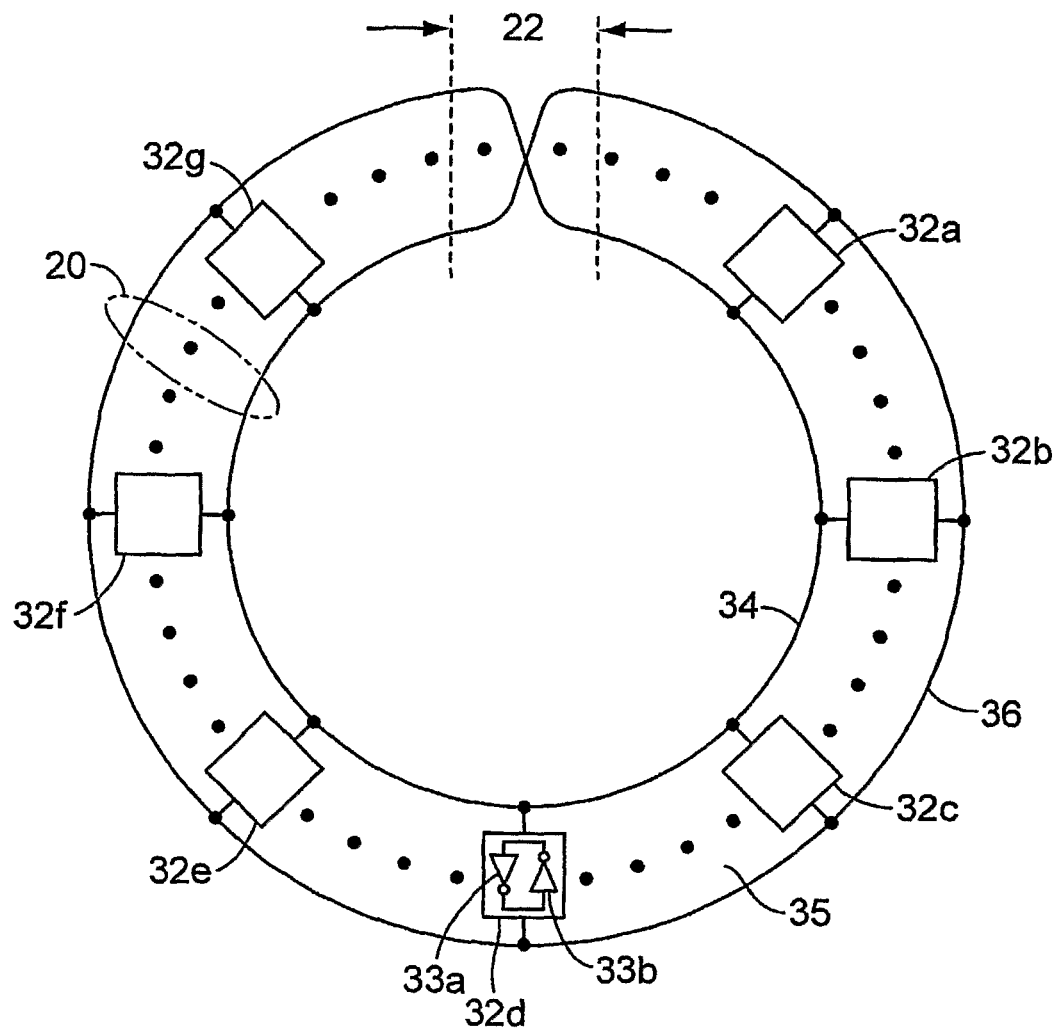
FIG. 3B shows a rotary clock in a circular configuration with a single cross-over and a representative regeneration element.

FIG. 3B shows a rotary clock in a circular configuration with a single cross-over 22 and a representative regeneration element. FIG. 3B is a circuit diagram for a pulse generator, actually an oscillator, using the transmission-line 35 of FIG. 1, specifically further having plural spaced regenerative active means conveniently as bi-directional inverting switching/amplifying circuitry 32a-g connected between the conductive loop traces 34, 36. The circuitry 32a-g is further illustrated in this particular embodiment as comprising two inverters 33aa, 33b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 32a-g is plural and distributed along the transmission-line 15, further preferably evenly, or substantially evenly; also in large numbers say up to 100 or more, further preferably as many and each as small as reasonably practical.

Inverters 33a, 33b of each switching amplifier 32a-g will have the usual operative connections to relatively positive and negative supply rails, usually V+ and GND, respectively. Respective input/output terminals of each circuit 32a-g are shown connected to the transmission-line 35 between the loops 34, 36 at substantially maximum spacing apart along the effectively single conductor, thus each at substantially halfway around the transmission-line 35 relative to the other.

Figure 3C:
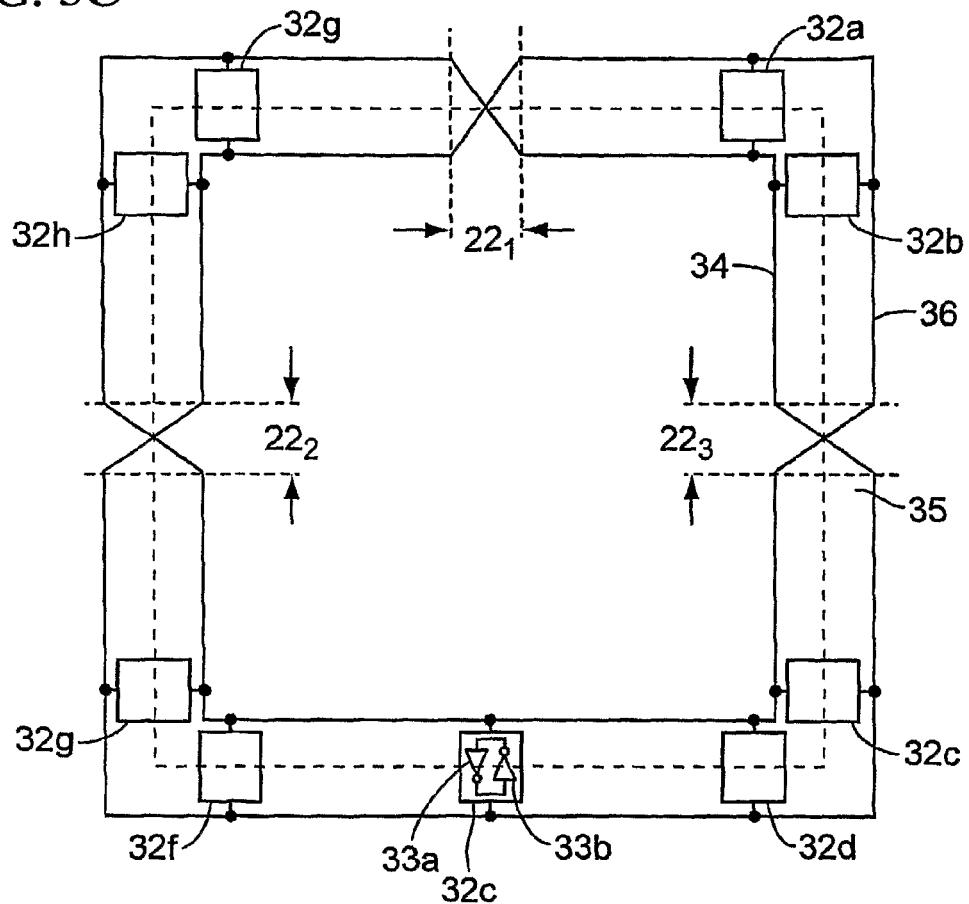
FIG. 3C shows a rotary clock in a square configuration with three cross-overs and a representative regeneration element.

FIG. 3C is another circuit diagram for an oscillator using a transmission-line structure hereof, but with three cross-overs $22_{1-3}$, thus the same Moebius strip-like reversing/inverting/transposing property as applies in FIG. 3B. FIG. 3C also shows a representative regeneration element 32e

The rectangular and circular shapes shown for the transmission-line 35 are for convenience of illustration. They can be any shape, including geometrically irregular, so long as they have a length appropriate to the desired operating frequency, i.e. so that a signal leaving an amplifier 32a-g arrives back inverted after a full 'lap' of the transmission-line 35, i.e. effectively the spacing between the loops 34-36 plus the crossover 22, traversed in a time Tp effectively defining a pulse width or half-cycle oscillation time of the operating frequency.

Advantages of evenly distributing the amplifiers 32a-g along the transmission-line 35 are twofold. Firstly, spreading stray capacitance effectively lumped at associated amplifiers 32a-g for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 35 better to compensate for losses associated with the transmission-lines dielectric and conductor materials. A continuous closed-loop transmission-line 35 with regenerative switching means 32a-g substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/2\pi\sqrt{L_e C_e}$ that is greater than the self-sustaining oscillating frequency F (F3, F5 etc.) of the transmission-line 15.

Figure 3D:
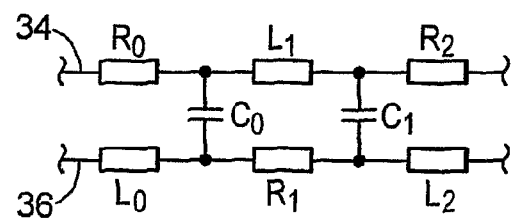
FIG. 3D shows a distributed electrical equivalent circuit or model of a portion of a transmission line.

FIG. 3D shows a distributed electrical equivalent circuit or model of a portion of a transmission-line 35 hereof. It shows alternate distributed resistive (R) and inductive (L) elements connected in series, i.e. $R_0$ connected in series with $L_1$ in turn connected in series with $R_2$ and so on for a portion of loop 34, and registering $L_0$ connected in series with $R_1$ in turn connected in series with $L_2$ and so on for the adjacent portion of loop 36; and distributed capacitive elements $C_0$ and $C_1$ shown connected in parallel across the transmission-line 35 thus to the loops 34 and 36 between the resistive/inductive elements $R_0/L_1$ and the inductive/resistive elements $L_0/R_1$, respectively for $C_0$ and between the inductive/resistive elements $L_1/R_2$ and the resistive/inductive elements $R_1/L_2$, respectively for $C_1$: where the identities R0=R1=R2, L1=L2=L3 and C0=C1 substantially hold and the illustrated distributed RLC model extends over the whole length of the transmission-line 35. Although not shown, there will actually be a parasitic resistive element in parallel with each capacitive element C, specifically its dielectric material.

Figure 3E:
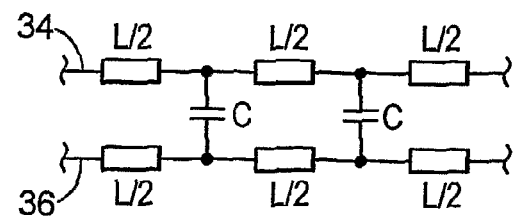
FIG. 3E shows a further simplified alternative distributed electrical equivalent circuit or model that ignores resistance.

FIG. 3E shows a further simplified alternative distributed electrical equivalent circuit or model that ignores resistance, see replacement of those of FIG. 3D by further distribution of inductive elements in series at half (L/2) their value (L) in FIG. 3D. This model is useful for understanding basic principles of operation of transmission-lines embodying the invention.

During a 'start-up' phase, i.e. after power is first applied to the amplifiers 32a-g, oscillation will get initiated from amplification of inherent noise within the amplifiers 32a-g, thus begin substantially chaotically though it will quickly settle to oscillation at a fundamental frequency F, typically within nano-seconds. For each amplifier 32a-g, respective signals from its inverters 33a and 33b arrive back inverted after experiencing a propagation delay Tp around the transmission-line 35. This propagation delay Tp is a function of the inductive and capacitive parameters of the transmission-line 35; which, as expressed in henrys per meter (L) and in farads per meter (C) to include all capacitive loading of the transmission-line, lead to a characteristic impedance Zo=SQR (L/C) and a line traverse or propagation or phase velocity-Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2Tp), for which the sub-divisor condition is satisfied. All other integer multiples of this frequency also satisfy this sub-divisor condition, but gain of the amplifiers 32a-g 'falls off', i.e. decreases, for higher frequencies, so the transmission-line 35 will quickly settle to fundamental oscillation at the frequency F.

The transmission-line 35 has endless electromagnetic continuity, which, along with fast switching times of preferred transistors in the inverters 33a and 33b, leads to a strongly square wave-form containing odd harmonics of the fundamental frequency F in effectively reinforced oscillation. At the fundamental oscillating frequency F, including the odd harmonic frequencies, the terminals of the amplifiers 32a-g appear substantially unloaded, due to the transmission-line 35 being 'closed-loop' without any form of termination, which results very desirably in low power dissipation and low drive requirements. The inductance and capacitance per unit length of the transmission-line 15 can be altered independently, as can also be desirable and advantageous.

For a traveling wave, the speed of the wave is $u_{osc} = f_{osc} \lambda_{osc}$, where $f_{osc}$ is the frequency of the oscillation and $\lambda_{osc}$ is the wavelength of the oscillator in the medium in which the oscillator is built. The speed of the wave in the medium is some fraction $0 < q \leq 1$ of the speed of light, $u_{osc} = qc$. In free space, $c = f_{osc} \lambda_{vacuum}$. Therefore, the wavelength of the oscillator is $\lambda_{osc} = q\lambda_{vacuum}$, i.e., it is shorter than the wavelength in free space. Because the physical length of the loop is always half the wavelength of the oscillator, $L_{osc} = \frac{1}{2}\lambda_{osc}$, the physical length of the loop is smaller than the wavelength of the oscillation in free space.

Figure 4A:
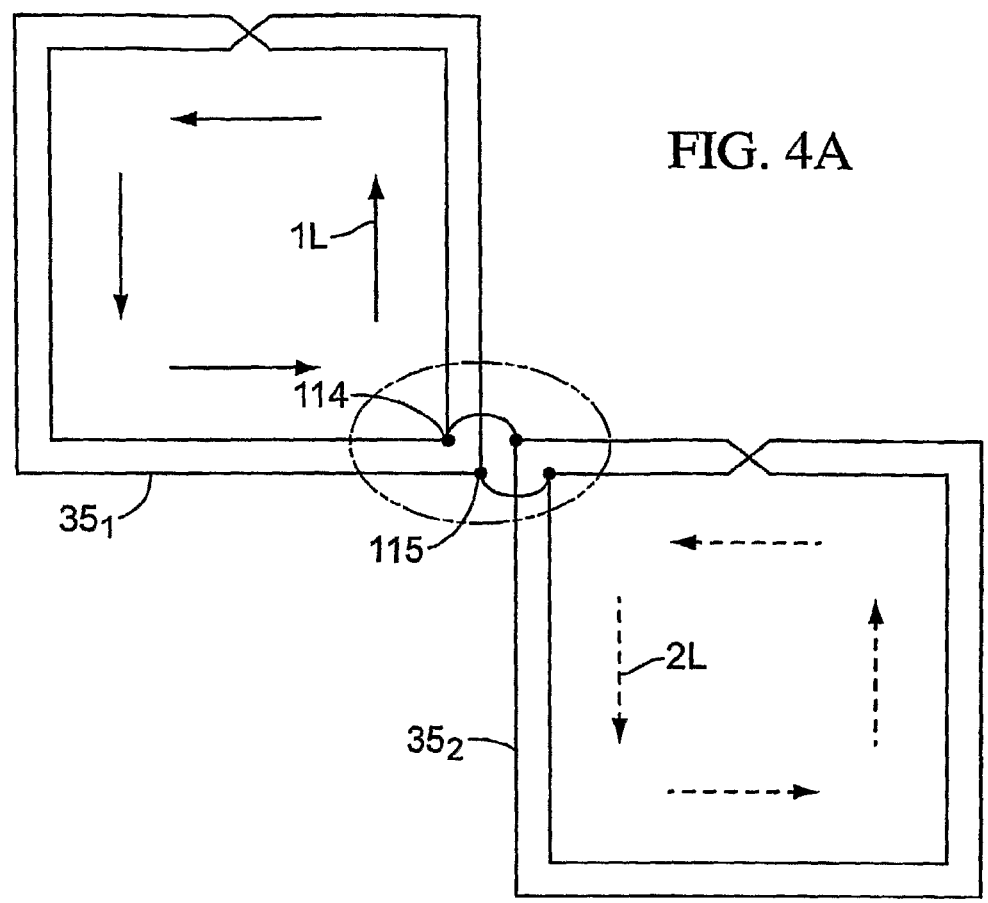
FIGS. 4A-4C show other connections for self-synchronising transmission-line oscillators.
Figure 4B:
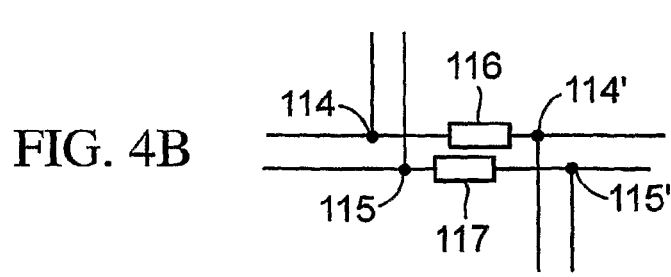
Figure 4C:
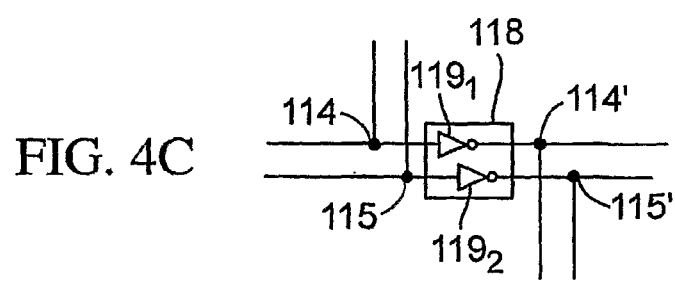

FIG. 4A shows another example of two substantially identical transmission-line oscillators with their transmission lines $35_1$ and $35_2$ operatively connected to be substantially self-synchronising in frequency and phase by direct connections at two discrete positions 114 and 115. FIG. 4B shows such direct connections via passive elements 116, 117 that could be resistive, capacitive or inductive or any viable combination thereof. FIG. 4C shows such direct connections via unidirectional means 118 that can be two inverters $119_1$ and $119_2$. The unidirectional means 118 ensures that there is no coupling or signal reflection from one of the transmission-lines ($35_2$) back into the other ($35_1$), i.e. only the other way about. Directions of travel of re-circulating EM waves are again indicated by arrows 1L, 2L that are solid but arbitrary for transmission-line oscillator $35_1$ and dashed for $35_2$ in accordance with expectations as to a 'parallel'-coupled pair of transmission-lines yielding contra-directional travelling waves.

Figure 4E:
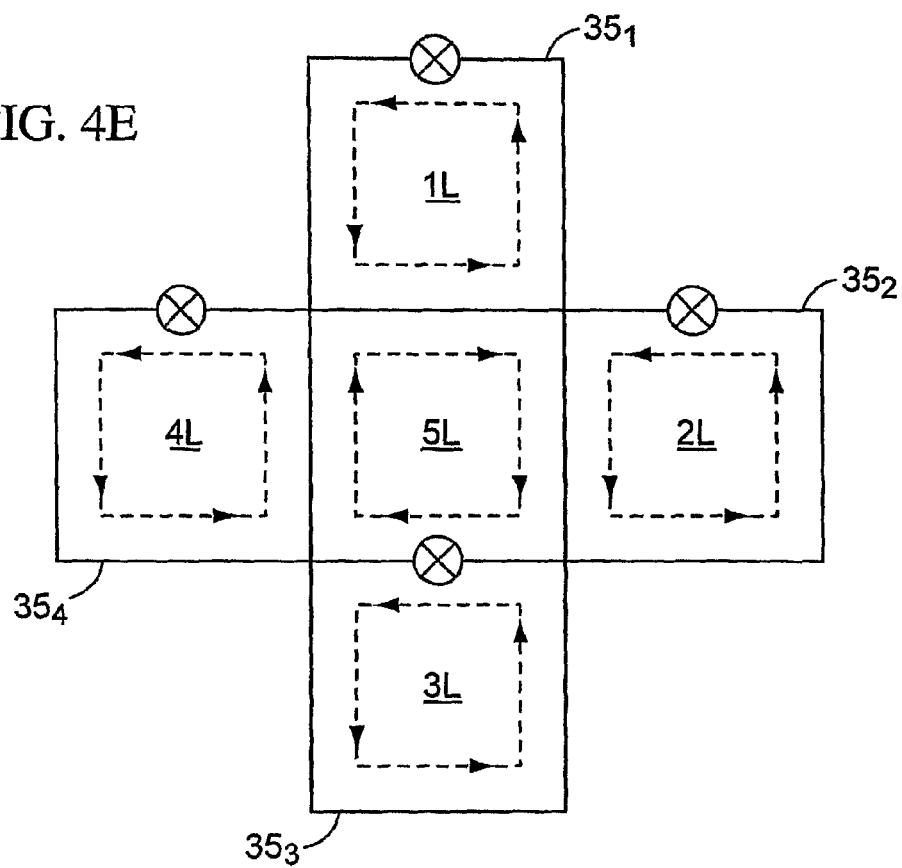
FIGS. 4E and 4F show connection of four transmission-line oscillators.

FIG. 4E shows four self-synchronised transmission-line oscillators $35_1$-$35_4$ connected together basically as for FIGS. 4A-4C, but so as further to afford a central fifth effective transmission-line timing signal source of this invention affording a re-circulatory travelling EM wave according to indicated EM wave lapping directions 1L-4L of the four transmission-line oscillators $35_1$-$35_4$. As shown the central fifth transmission-line oscillator physically comprises parts of each of the other four, and has a lapping direction 5L that is opposite to theirs, specifically clockwise for counter-clockwise 1L-4L. It will be appreciated that this way of connecting transmission-line oscillators together can also be extended to any desired number and any desired variety of overall pattern to cover any desired area.

Figure 4F:
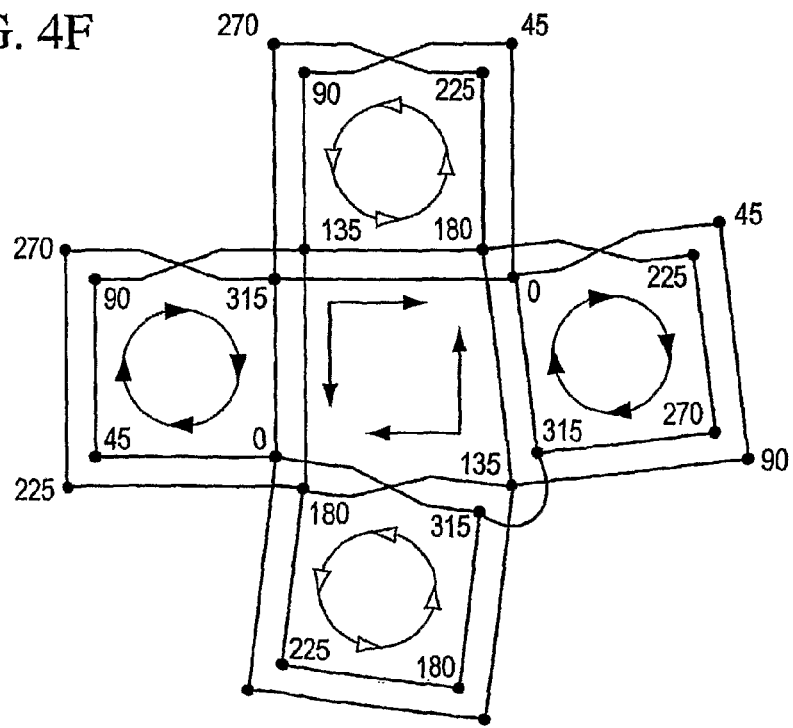

An alternative is shown in FIG. 4F where the central fifth transmission-line oscillator is not of re-circulating type, but is nonetheless useful and could be advantageous as to access to desired phases of timing signals.

Figure 4G:
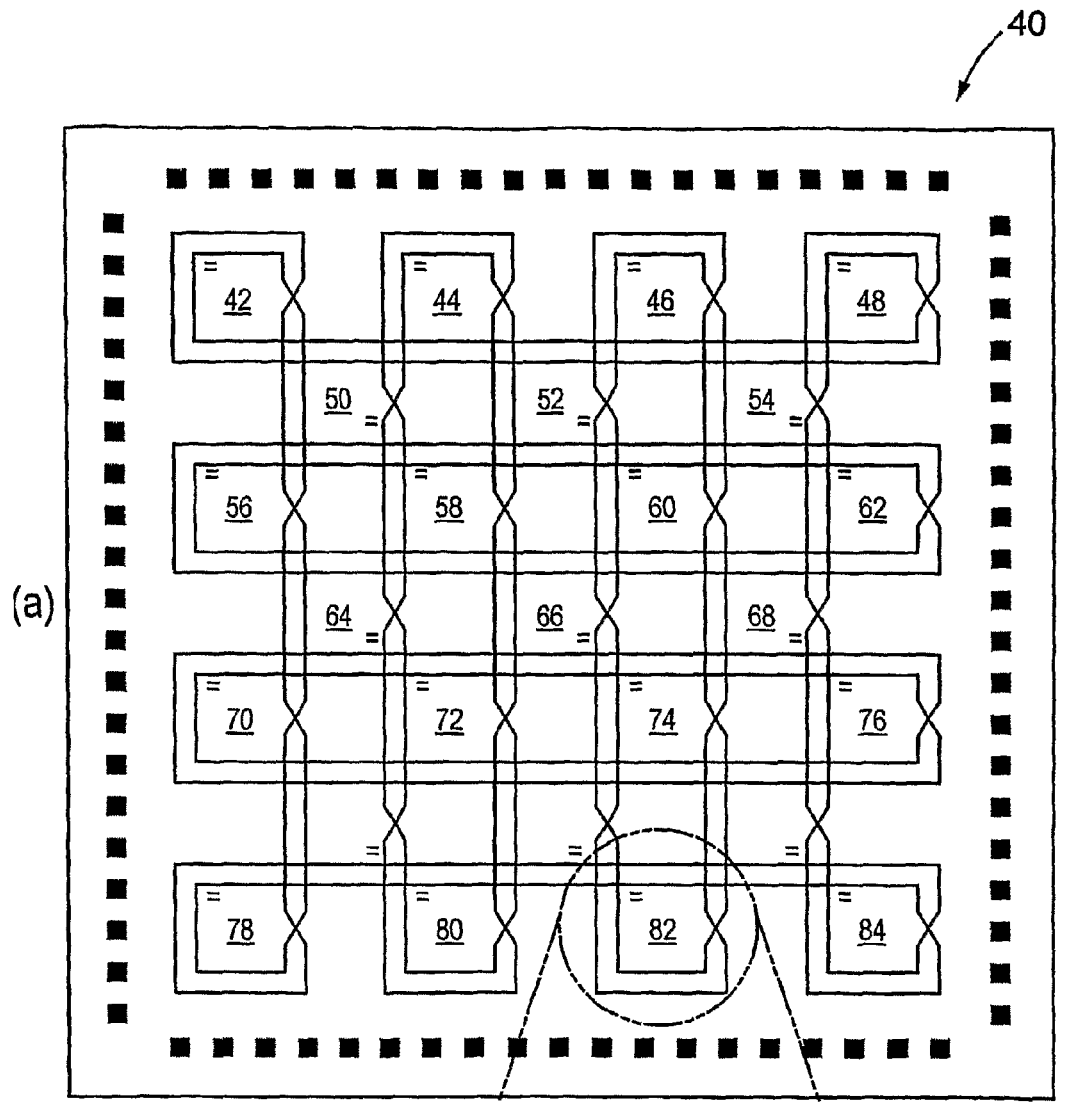
FIG. 4G shows an array of rotary clock loops each interconnected with a neighboring loop.

FIG. 4G shows an array 40 of rotary clock loops 42-84, each interconnected with neighboring loops. Arrays of rotary clocks can experience random and systematic variations.

Random Variation

An estimate of random variation is as follows. The speed of the wave in any one of the loops is approximately $u_p = 1/\sqrt{L_{per\_m} C_{per\_m}}$. Assume that the propagation velocity (and thus rotation time) is dominated by variation in capacitance at each point of connection to the loop, rather than parasitic capacitance of the wires, and that individual connection point capacitances can have a random variation of ±30%, a standard deviation $\sigma$ of 10%, and a $3\sigma$ of 30%. If each ring has roughly N=1000 connection points, then the rotation time in each ring depends not on the variation of individual connection capacitance but instead on the variation in the sum of the N capacitances. The variation in the sum is $\sigma_N = \sigma/\sqrt{N} = 10\%/\sqrt{1000}$, so $\sigma_N = 0.32\%$, and $3\sigma_N = 0.96\%$. From this, the variation in propagation velocity (and thus rotation time) can be computed. If rings are not connected to each other, then the minimum and maximum propagation velocities, respectively, are $u_{p\_min} = u_p(1/\sqrt{1.0096}) = 0.995 u_p$, $u_{p\_max} = u_p(1/\sqrt{0.9904}) = 1.0055 u_p$.

As shown and described in U.S. Pat. No. 6,556,089, multiple loops can be arranged in a pattern over an area. Coupling the rings together to make the rings coherent dramatically reduces the 0.5% variation calculated above. This coupling thus makes it possible to distribute highly accurate coherent oscillators over a large area. One means of coupling is by injection locking each oscillator to is neighboring oscillators. Other ways of coupling, such as magnetic coupling, to make the rings coherent are possible as well. If the distance over which the oscillators must be distributed is a physical aperture A of say 100 wavelengths (in vacuum), then the time of flight (at c) is $t_{flight} = 100T$, where T is the period of the oscillation. If 100 phase steps of resolution are desired, i.e., one phase step is T/100, then a timing uncertainty over the aperture, i.e., the phase step resolution/time of flight, is less than 0.01%, which in the case of 10 GHz is about 1 pS out of 10 ns. Normally, this would be difficult. However, because interconnected arrays of rotary clocks are injection locked and therefore coherent, arrays of rotary clock oscillators can be used to meet the above specification across several meters.

Systematic Variation

Figure 5A:
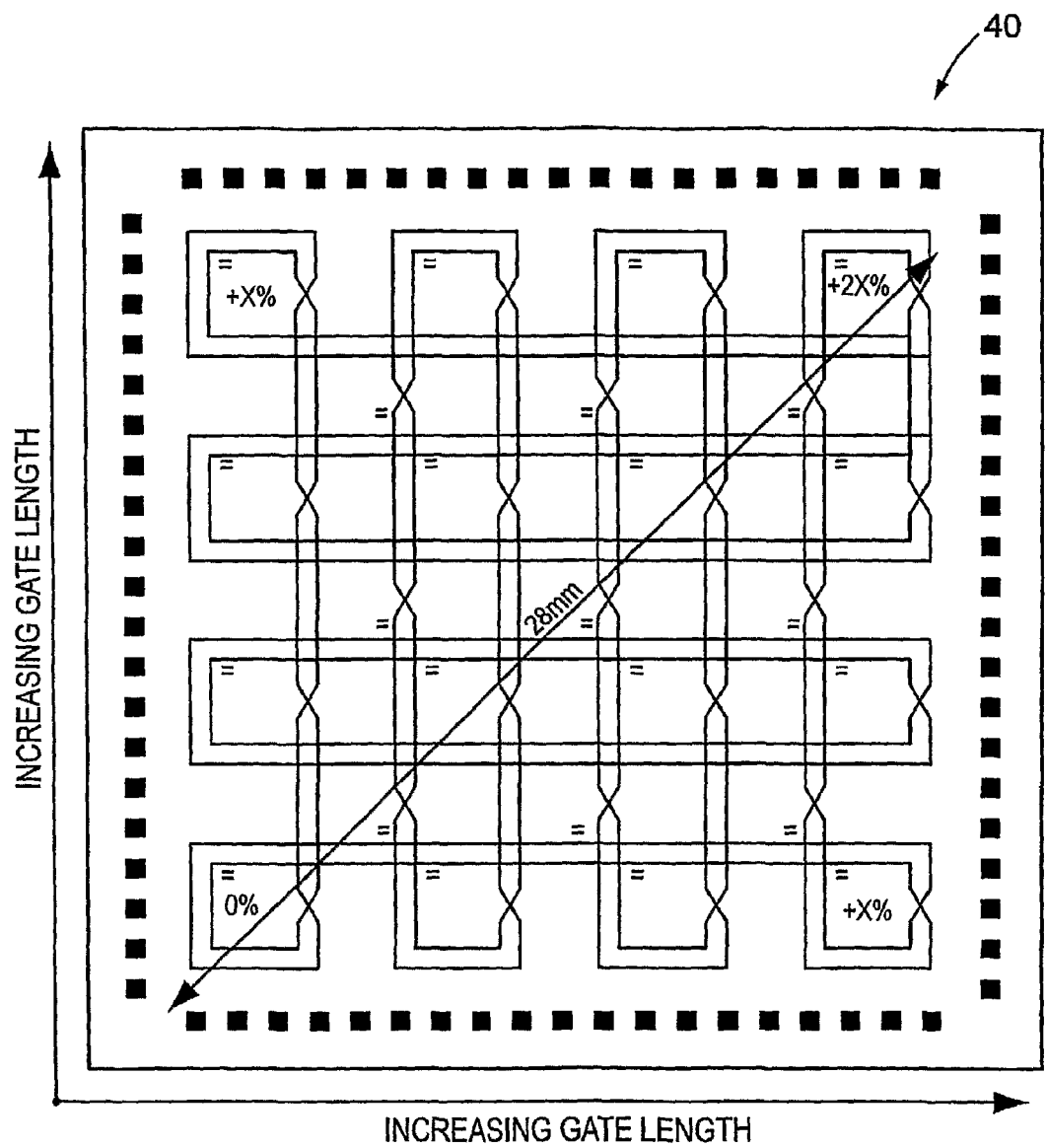
FIG. 5A shows skew due to a systematic variation across an array of rotary clock loops.

On the other hand, instead of random variations over the array 40, it is possible to have systematic skew over the array 40, as illustrated in FIG. 5A. Assuming a systematic diagonal variation in gate length, this causes a systematic variation in capacitive loading. At 5 GHz (200 pS period) the rings are 2 mm on a side. An array of 10 rings by 10 rings (larger than shown at right) therefore has a physical grid size of 20 mm×20 mm and a corner to corner distance of about 28 mm. Lower left ring has the least capacitive loading and the upper right ring has the most capacitive loading. If the total corner-to-corner variation is 5%, then the total skew across the 28 mm is about 15.2 pS, which is about 0.5 pS/mm. In general, electronic calibration can remove any systematic and relatively slowly changing spatial variation from a system due to such causes as manufacturing and temperature differences over the array. This is as applicable to radar systems as any another.

In the present invention, each rotary oscillator has a tuning system that includes a plurality of switched capacitors and varactors for tuning the oscillator. These switched capacitors and varactors are placed around the oscillator in an approximately even distribution. Tuning an oscillator means altering the value of a varactor's capacitance or determining which switched capacitors are connected to the oscillator. The capacitance of the varactors and switched capacitors affects the speed of the wave in the oscillator and therefore the frequency and phase of the oscillator. See US Patent Publication 2003/0151,465, Aug. 14, 2003, FIG. 24 and paragraphs 228-229.

Figure 5B:
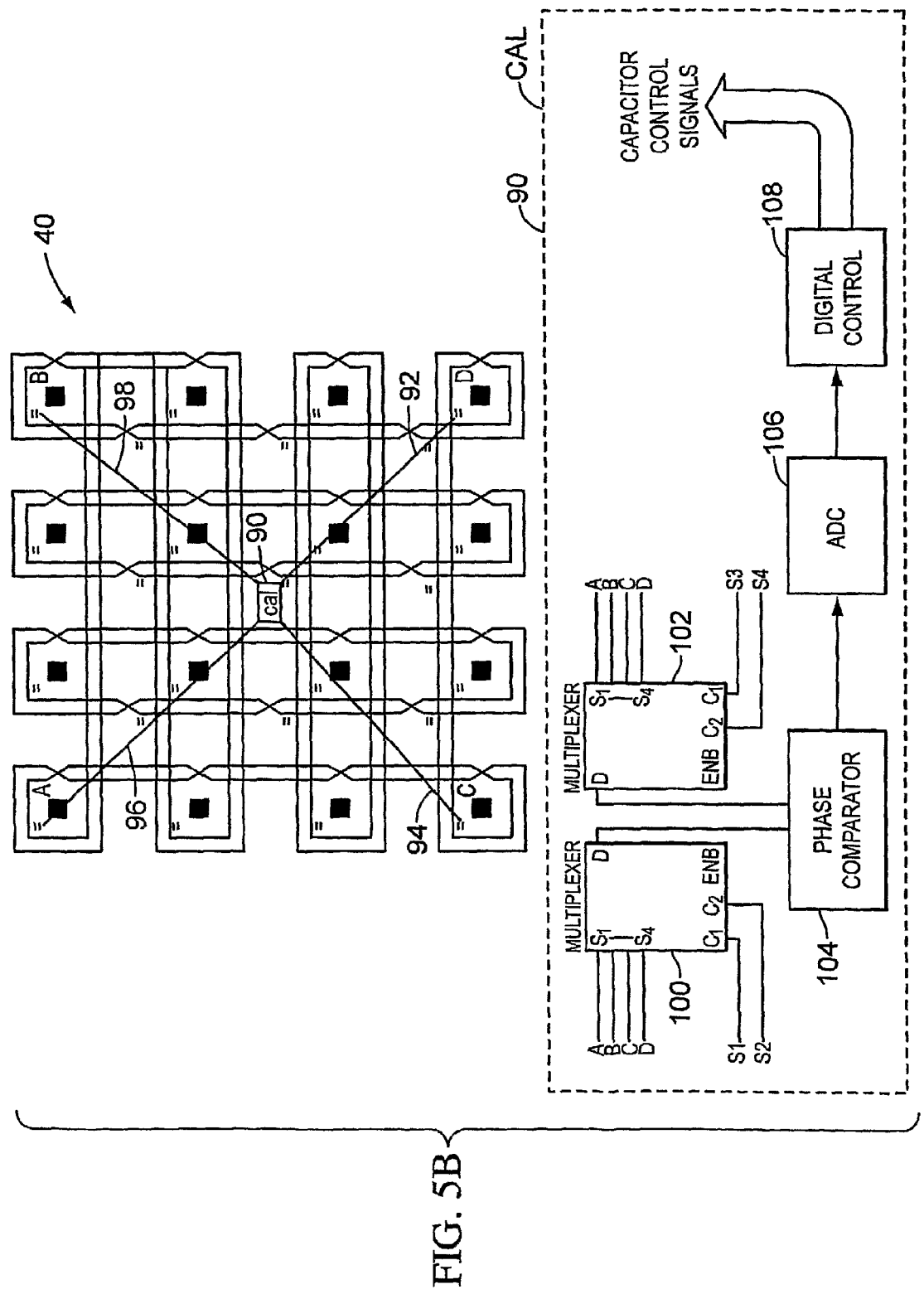
FIG. 5B shows a system for calibrating out the systematic or slow variations of the array.

FIG. 5B shows one possible system for calibrating out the systematic or slow variations of the array 40. In principle, the calibration can occur before or during the functioning of the antenna system. In the figure, a calibration circuit 90 is connected to a number, say four, tap points A, B, C, and D, approximately at the corners of the array. These points are preferably chosen to be nominally equal phase points of different oscillators in the array 40. Equal distance transmission lines 92-98 connect these tap points A, B, C, and D to the calibration circuit 90, which is depicted below the array. This embodiment of the calibration circuit includes two multiplexers 100, 102, each connected to the four tap points. Four select lines, S1, S2, S3, and S4 select the outputs for the multiplexers. The outputs of the multiplexers connect to a phase comparator 104 whose output is converted to a digital signal by an ADC 106. A digital control block 108 then distributes signals to the various control lines of the switched capacitors and varactors of the array. In operation, the calibration circuit 90 compares pairs of signals from the array in any combination and determines their phase difference. It then uses these phase differences to adjust the oscillators via the capacitors to reduce the phase differences. When the phase differences of each combination (six in this case) of signals have been reduced as much as possible, the array is calibrated. It should be noted that such a calibration system can be used to tune out not just manufacturing differences in oscillators but also temperature gradients across the array. Temperature gradients can occur when the power generated at each element is not the same. Optionally, a temperature sensor can be included at each of the oscillator sites in the oscillator array. The temperature sensor outputs can then be used to modify the local varactor or switched capacitors in each oscillator to correct for a known oscillator temperature coefficient.

Another way of calibrating the array 40 of oscillators is to have the antenna array receive or send a radiated test pattern and derive the settings for the capacitors of each oscillator manually to achieve the best results over multiple angles. For each transmit or receive angle, the settings of the capacitors are derived to achieve the desired result. Once these settings are known, they can be stored and later used to operate the antenna array.

Figure 6:
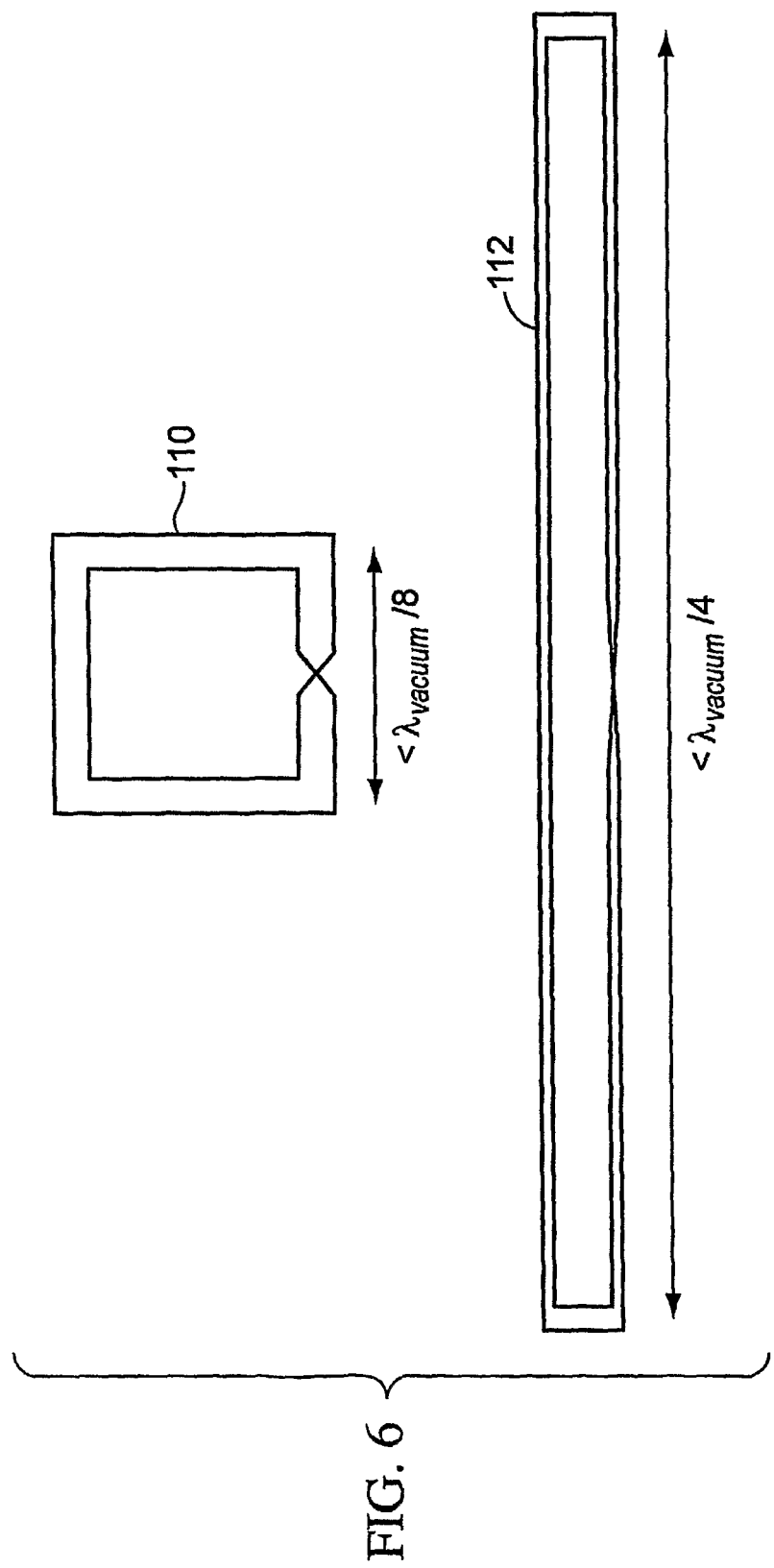
FIG. 6 shows different geometries for the rotary clock loop in relation to the wavelength.

FIG. 6 shows different geometries 110, 112 for the rotary clock loop in relation to the wavelength. As mentioned above, a clock loop can have any physical shape and size. FIG. 6 shows that a side of the loop 110, when configured as a square, is $\lambda_{osc}/8$ and this is less than $\lambda_{vacuum}/8$. For a loop built 112 with a large aspect ratio, the long side of the loop is less than $\lambda_{vacuum}/4$. Larger aspect ratio loops help to reduce the number of loops necessary to span a given distance.

In addition to controlling the phase of each element of the array, it is desirable to control the specific cycle or cycles of oscillation during which elements of the array are activated. In other words, it is desirable to control the absolute phase over multiple cycles, not just the phase within a cycle. This feature allows one to specify, for example, the correct cycle on which to start radiating a pulse and stop radiating pulse from each element of the array.

Figure 7:
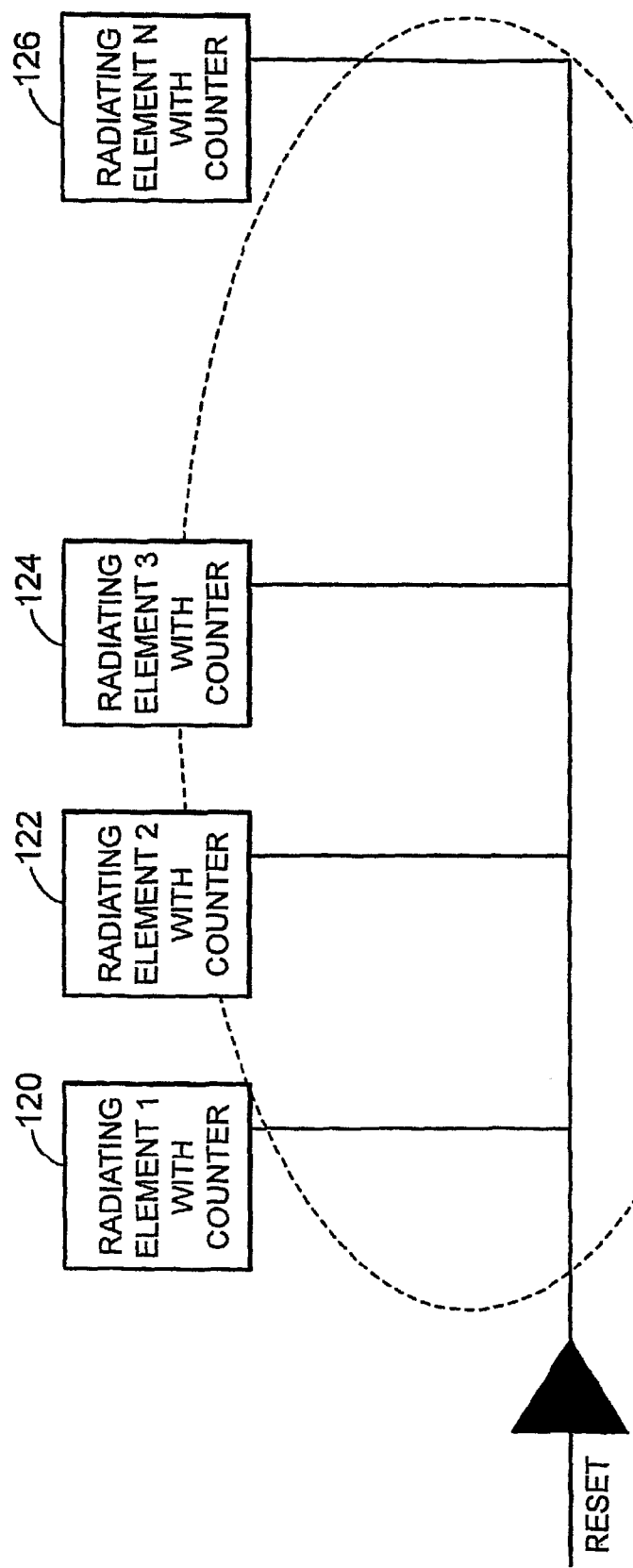
FIG. 7 illustrates an arrangement in which it is uncertain that each radiating element will operate on the same clock cycle due to the arrival time of the reset signal.

FIG. 7 illustrates an arrangement in which it is uncertain that each antenna element 120-126 will operate on the same clock cycle. Each antenna element could determine correct phase by selecting the correct tap location of a nearby ring. Determining the correct cycle count, however, requires a cycle counter accessible to each element. If this is done by placing a cycle counter at each antenna element, then each counter must be reset simultaneously. This requires distributing a RESET signal to all elements. However, distributing this signal in this manner across a meter size antenna within 1 cycle (100 pS at 10 GHz) is very difficult. Fortunately, the RESET signal (and any other signal) can be 'pipelined' across the full length of the aperture while maintaining cycle level accuracy.

Figure 8:
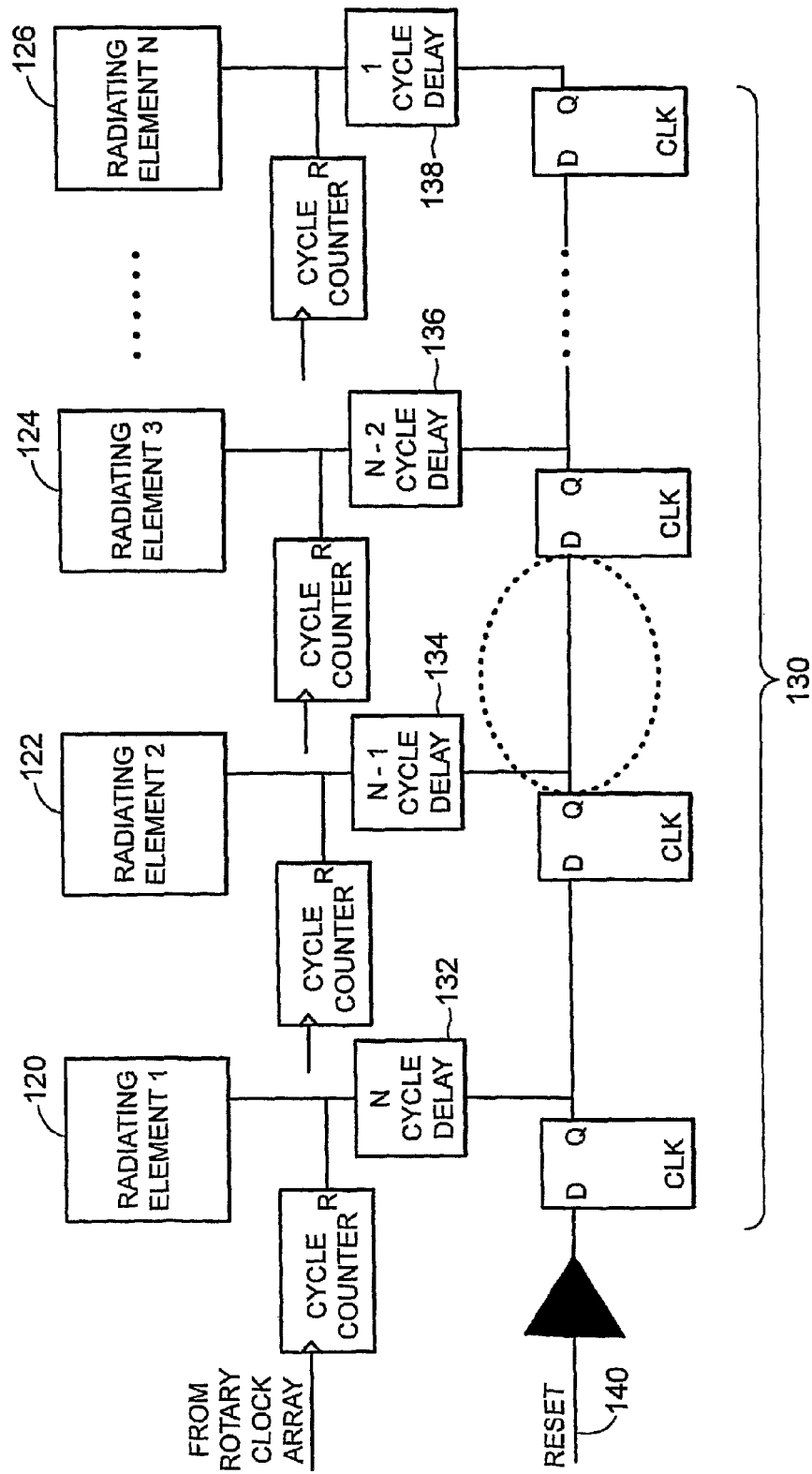
FIG. 8 illustrates an arrangement in which an enable signal is pipelined so that each radiating element operates on the same clock cycle.

FIG. 8 illustrates an arrangement in which an enable signal is pipelined so that each antenna element maintains a correct cycle count. The pipeline 130 has N+1 stages, where N+1 is the number of cycles it takes to traverse the array, approximately. Connected to each pipeline stage is a delay circuit 132-138, whose delay, in cycles, equals the total number of stages in the pipeline (N+1) less the delay, in cycles, at the pipeline stage to which the delay circuit is connected. For example, if the delay circuit is connected to the third stage in the pipeline, then the delay is (N+1−3)=N−2. Thus, in the figure, each antenna element 120-126 has an N+1 cycle delay regardless of its position is in the array. Once the number of cycles to travel to the most distant antenna element is known, the pipeline can easily be constructed. Pipelining uncertainty between adjacent elements needs to be controlled, but can easily be kept to within one cycle.

Advantages of Pipelining

Without pipelining the timing uncertainty across the entire aperture needs to be kept to within 1 cycle. With pipelining the timing uncertainty from one pipeline stage to the next needs to be kept to within 1 cycle, which is a much simpler task. Pipelining stages could be more closely spaced than the radiating elements themselves, if necessary. The total delay from one pipeline stage to the next could be greater than a cycle time so long as the uncertainty in the delay is less than one cycle. For example, the delay from one element to the next could be 1.5 cycles ±0.4 cycles. The uncertainty is 0.8 cycles and still acceptable. An ENABLE or RESET signal 140 can synchronize the cycle count for all radiating locations. Many other signals can be similarly pipelined including all signals necessary to load waveforms into each element.

Figure 9:
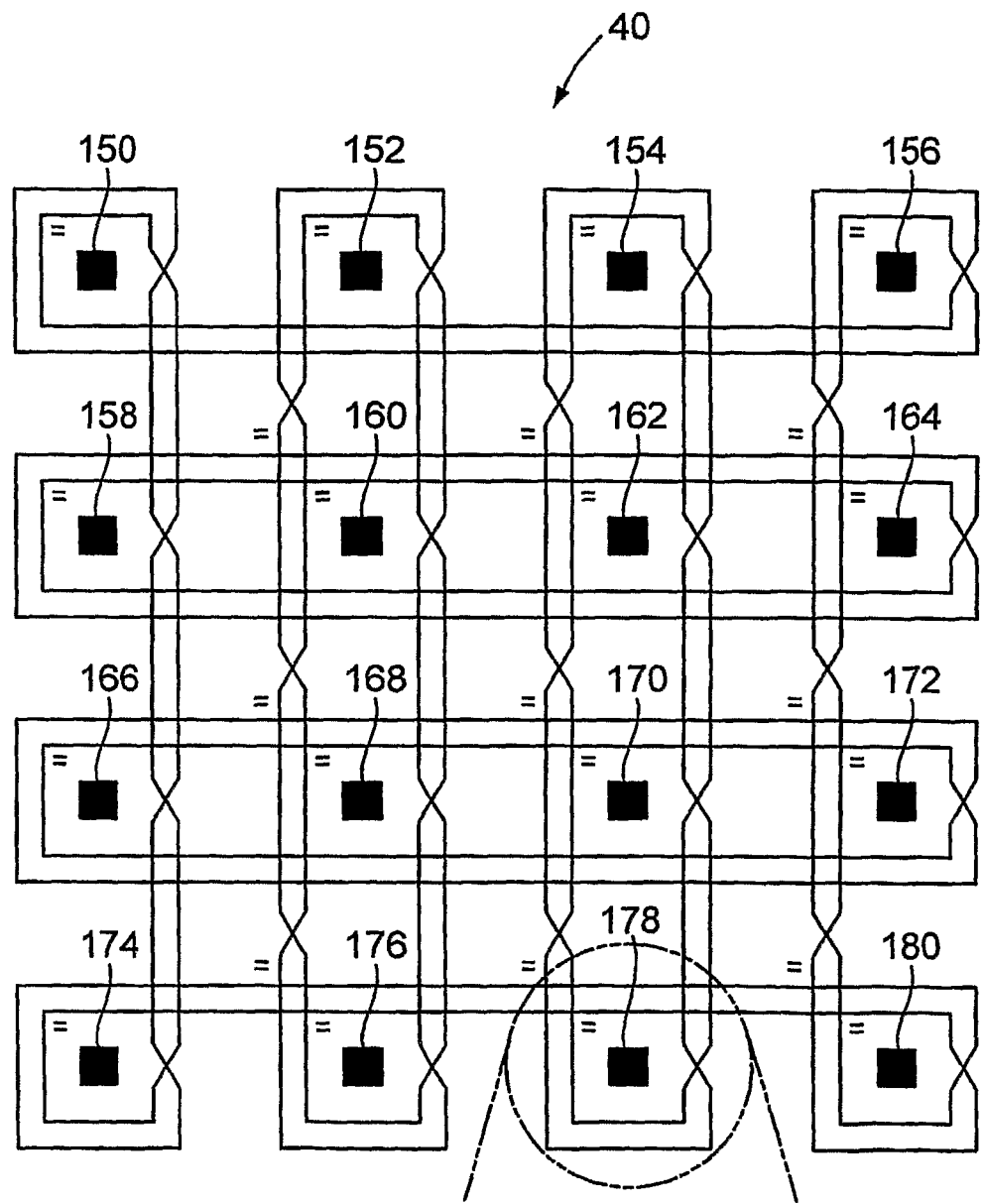
FIG. 9 shows an array of rotary loops in a tight grid pattern with a multiplexer in each loop for selecting the phase from the rotary loop for use in a mixer or phase array circuit.

FIG. 9 shows an array of rotary loops in a tight grid pattern with a multiplexer 150-180 in each loop for selecting one of a number of phases of a local VCO or mixer. The grid can be populated more sparsely than shown. In the figure, the "=" indicates similar phase positions in each of the rotary loops.

Figure 10:
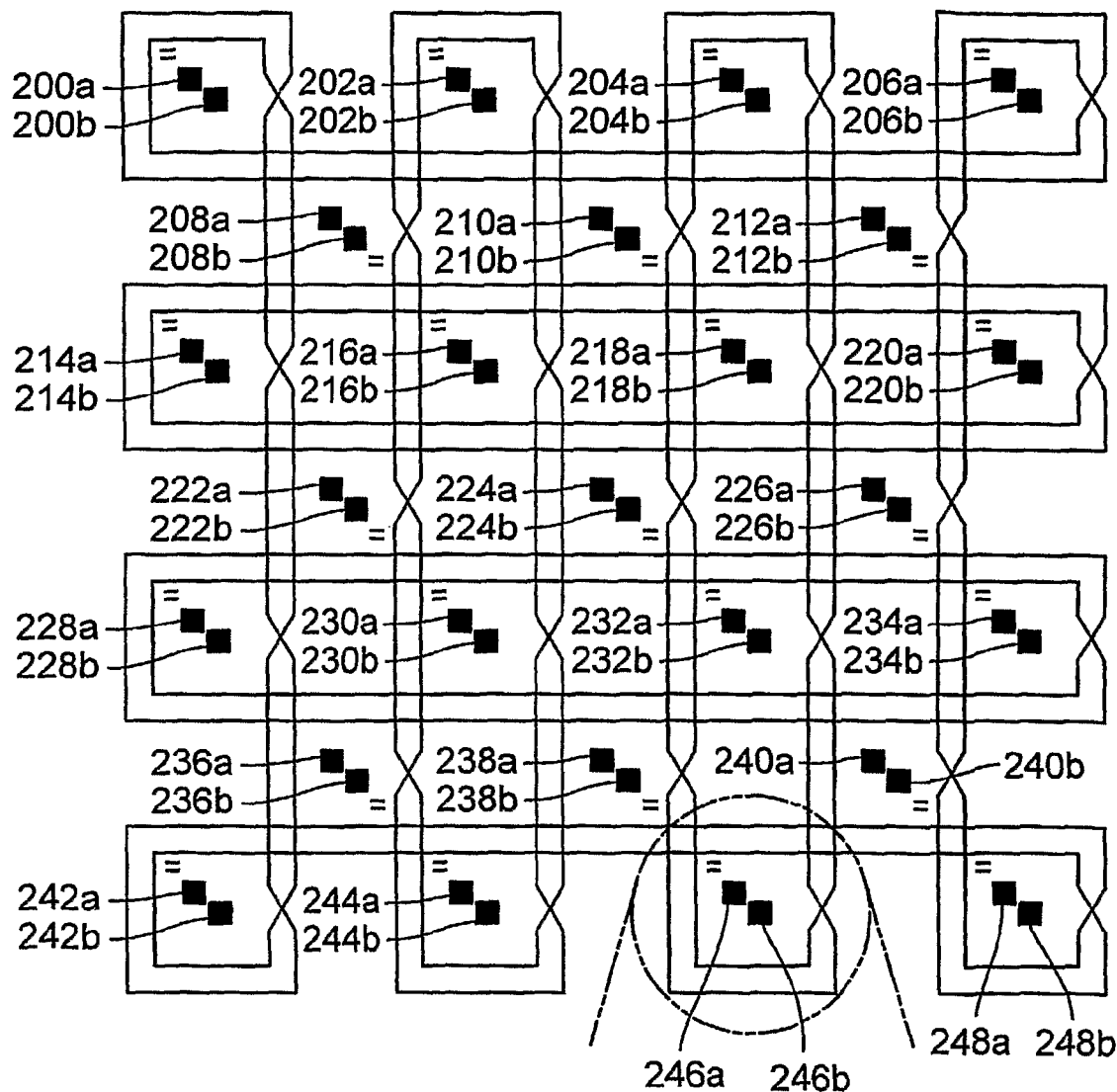
FIG. 10 shows an array of rotary loops in a tight grid pattern with an ADC and DAC in each ring.

FIG. 10 shows an array of rotary loops in a tight grid pattern with an ADC 200a-248a and DAC 200b-248b in each ring. In the figure, the "=" indicates similar phase positions in each of the rotary loops. Again, the grid can be populated more sparsely than shown. There is more flexibility from using a DAC and power amplifier even though the rotary ring can drive the antenna directly, possibly reducing energy requirements. If rotary ring is used as the local oscillator for the antenna system, multiple taps from the rotary ring can be combined at the antenna input to form any arbitrary waveform including sinusoids and triangle waves. The phase and weighting of each tap is used to build an arbitrary waveform, as described in International Application PCT/GB03/000719, filed Feb. 14, 2003, and U.S. application Ser. No. 10/504,559, which is incorporated by reference into the present application.

Figure 11:
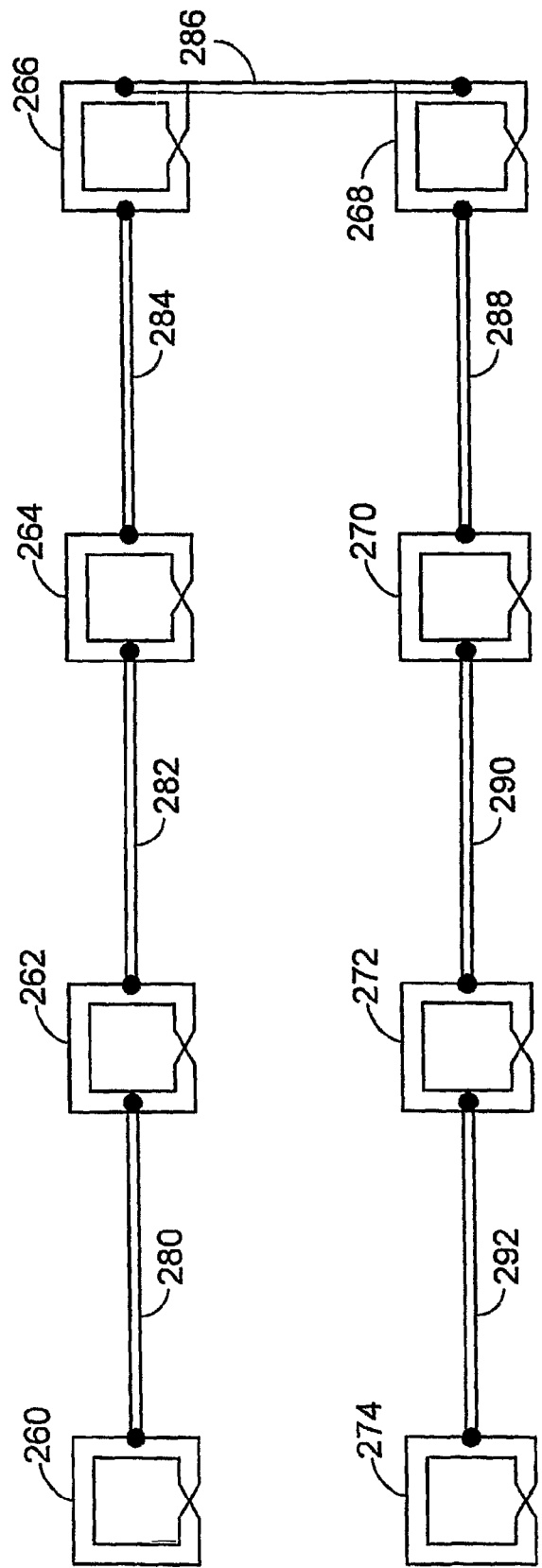
FIG. 11 shows a plurality of rotary loops connected by transmission lines having a length that preserves coherence between the loops.

FIG. 11 shows a plurality of rotary loops 260-274 connected by transmission lines 280-292 having a length that preserves coherence between the loops. The transmission lines 280-292 used are the exact length, such as multiples of ½ wavelength, needed to maintain coherence between rings. The rings 260-274 can be connected in a series, a grid, a star, or some other combination. The series pattern is shown in the figure. Some of the transmission lines have twists to ensure phase matching.

Figure 12:
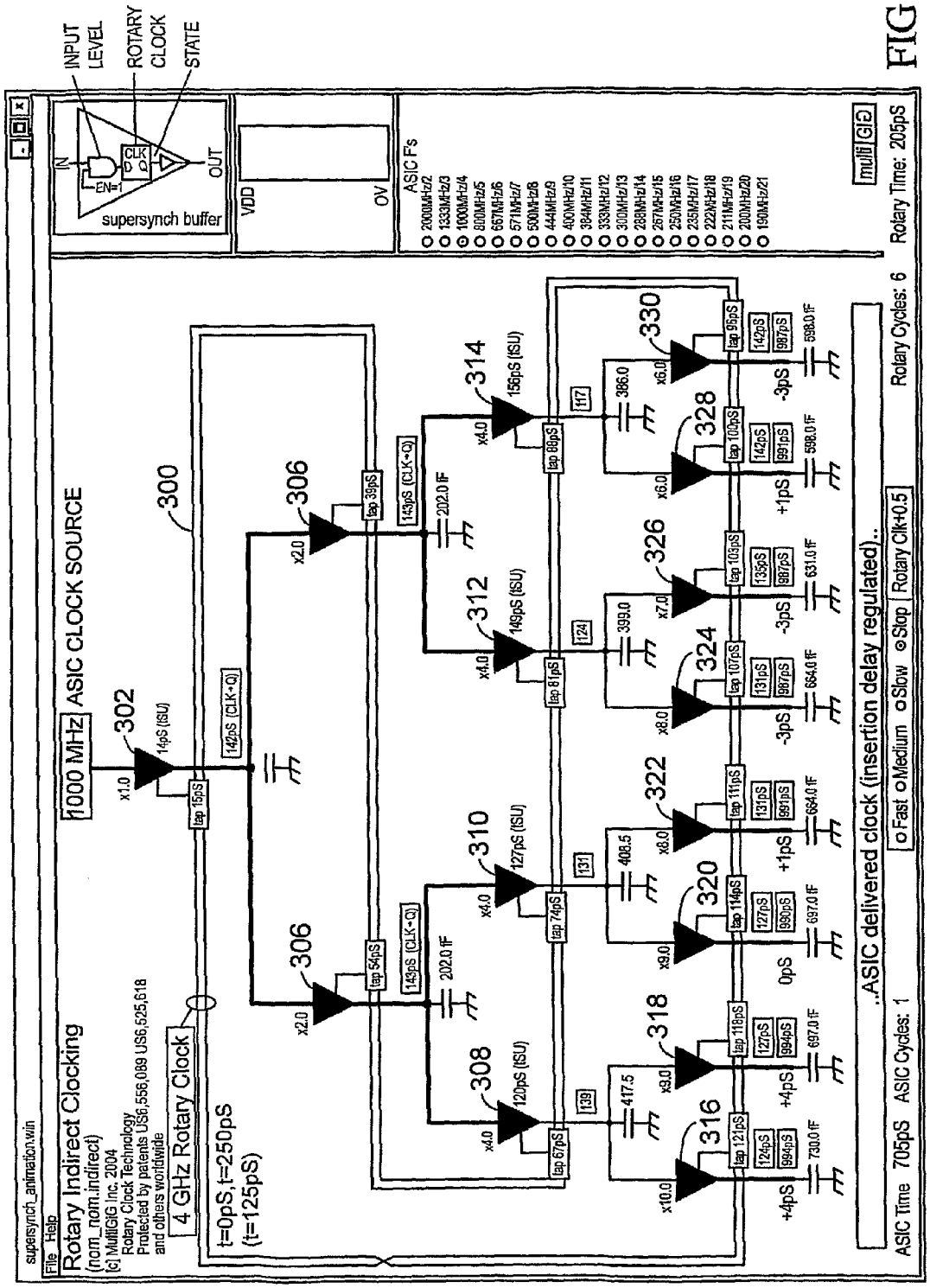
FIG. 12 shows an implementation of indirect rotary clocking.

FIG. 12 shows an implementation of indirect rotary clocking. In this system, the rings run at a multiple of the radar frequency. For example, for a radiation frequency of 1 GHz, suppose a 4 GHz rotary ring is used. In indirect rotary clocking, a 4 GHz loop 300 is constructed that provides a monotonic set of phase shifted clocks for a set of drivers arranged in a tree structure. Each driver 302-330 is a gated, bistable device, as shown, that is clocked from the ring. This endows the radiation frequency clocks at the end nodes with the high stability and low jitter characteristics of the 4 GHz rotary ring. Also, each level of the tree is effectively pipelined with respect to an adjacent level. In the example shown, there is about 25-30 pS of time between each stage of buffers, giving sufficient time for the buffers at each stage to perform their function. This implementation can be used as a corporate feed for an array of antenna elements.

An alternative to the indirect clocking system is that the rotary clock rings run at a fraction of the radar frequency. In this case, for a 10 GHz radiated frequency, 1 GHz rotary rings are used and there are multiplying PLLs located in each radiating element. The radiating elements can be grouped to reduce the number of multiplying PLLs, if necessary. Use of a multiplying PLL introduces a small phase uncertainty.

An alternative to the use of PLLs is the use of an injection-locked higher frequency local ring. A second local ring running at say three times the frequency can injection lock to the first ring.

Figure 13A:
FIGS. 13A-C show a filamentation technique for reducing ac resistance and decreasing distance between differential pairs.
Figure 13B:
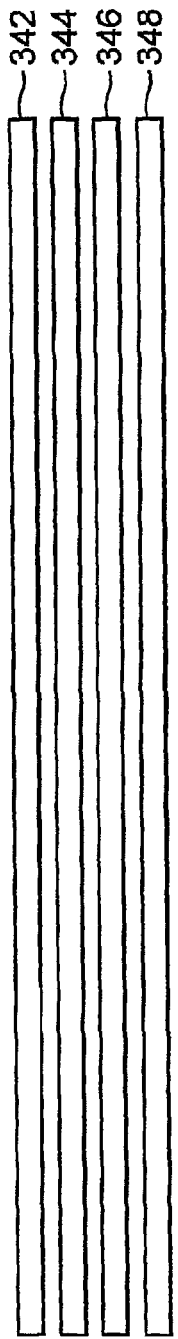
Figure 13C:

It may be important to insure that there is a high quality waveform on the rotary clock, without which it may be difficult to maintain low phase noise on the oscillators. FIGS. 13A-C show a filamentation technique for reducing ac resistance and decreasing distance between differential pairs, which will help maintain the quality of the waveform, especially the short transition times. A wire 340 having a particular width is broken up into multiple filaments 342-348 which together have about the same width. Using multiple filaments 342-348 reduces the skin effect when the dimension of each wire approaches or is less than about two skin depths at the frequency of operation. The total number of filaments used determines the total effective cross-section of the 'composite' wire. However, the magnetic interaction among the filaments is not uniform. Additional manipulation (the weaving shown in the FIG. 13C) of the physical position of the filaments helps each of the filaments have the same magnetic interaction with the other filaments and this helps even the current flow among all of the filaments. See U.S. Publication US 2003/0151,465, filed Apr. 7, 2003 and International Application PCT/GB01/02069, filed May 11, 2001, both of which are incorporated by reference into the instant application.

Figures 14A, 14B, 14C:
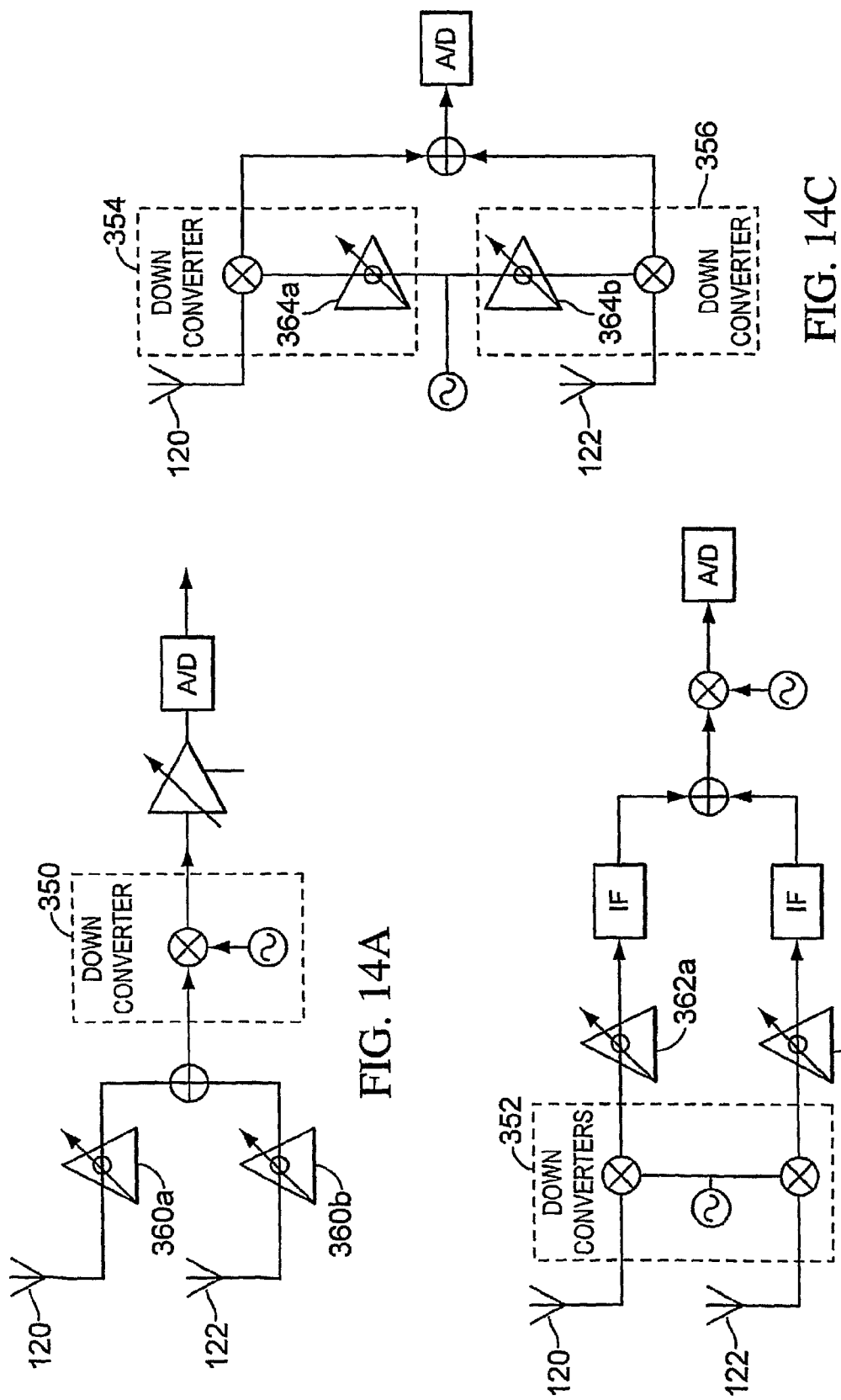
FIGS. 14A-C show various alternatives for utilizing a phase shifter in a receiver.

For receiving, there are a variety of ways of introducing a phase shift into the signal path for a pair of antenna elements, though it applies to any number of elements. One way is to implement a phase shift 360a,b directly in the RF path, as shown in FIG. 14A. Other ways of introducing a phase shift include placing a shifter 362a, 362b in the IF path (FIG. 14B), i.e., after down converting via 352 from RF, and phase shifting 364a, b the local oscillator used for the down conversion using 354, 356 (FIG. 14C). The latter is the preferred system for use with rotary oscillators. One or more rotary oscillators provide the local oscillator signal with a selectable phase shift and clock cycle for use by the down-converter. FIG. 16B shows a receiver arrangement with a pair of rotary oscillators.

Figure 15A:
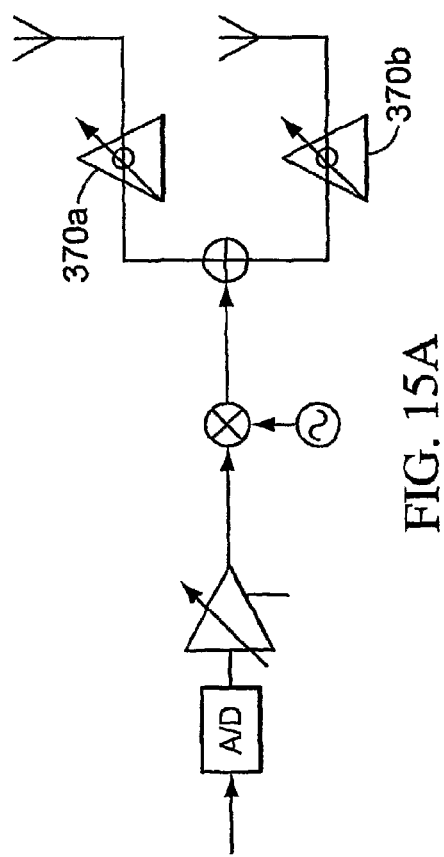
FIGS. 15A-C show various alternatives for utilizing a phase shifter in a transmitter.
Figure 15C:
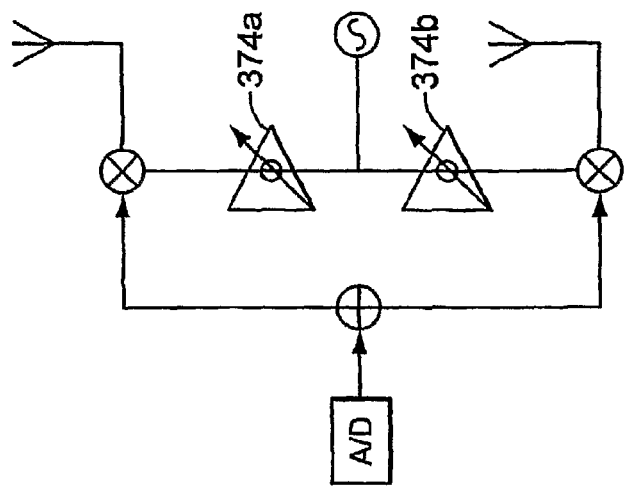
Figure 15B:
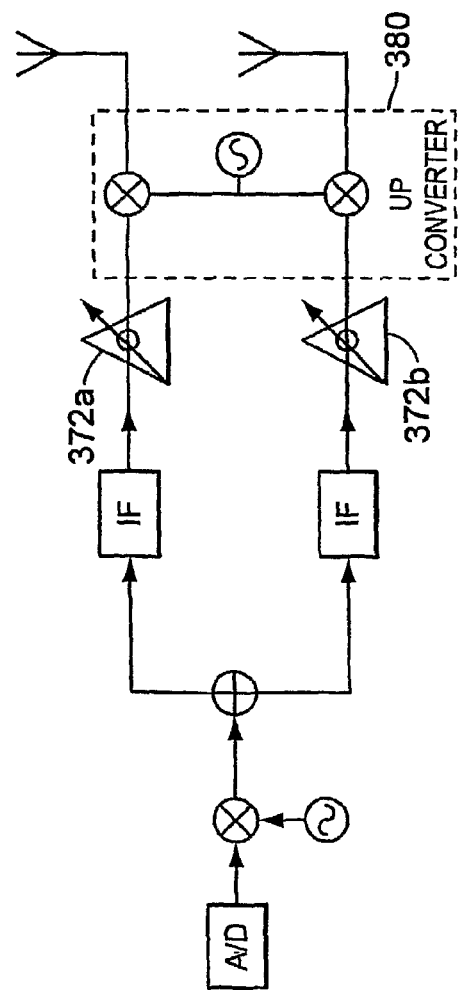

Similarly, for transmitting there are a variety of ways of introducing a phase shift into the signal path for a pair of antenna elements, though it applies to any number of elements. FIGS. 15A-15C show the possibilities. FIG. 15A shows direct phase shifting of the RF signal via 370a, b. FIG. 15B shows phase shifting the IF signal via 372a,b prior to up-converting via 380 to RF and FIG. 15C shows phase converting via 374a,b the local oscillator used for the up-conversion to RF. Again, the system in FIG. 15C is preferred for use with arrays of rotary oscillators. FIG. 16A shows a transmitter arrangement with up-converters 382, 384 and a pair of rotary oscillators.

Figure 17A:
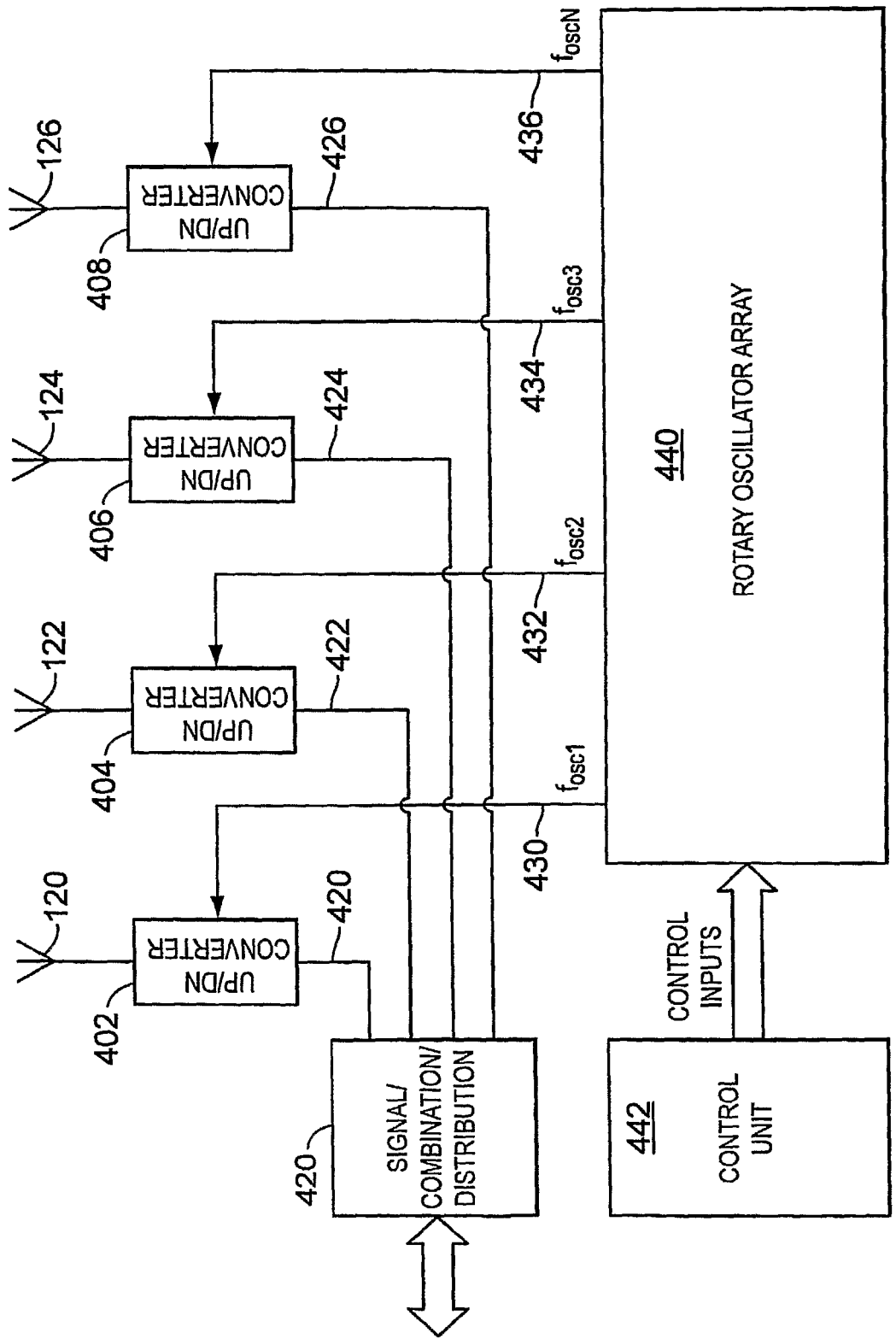
FIGS. 17A-C show a phased array antenna system.
Figure 17B:
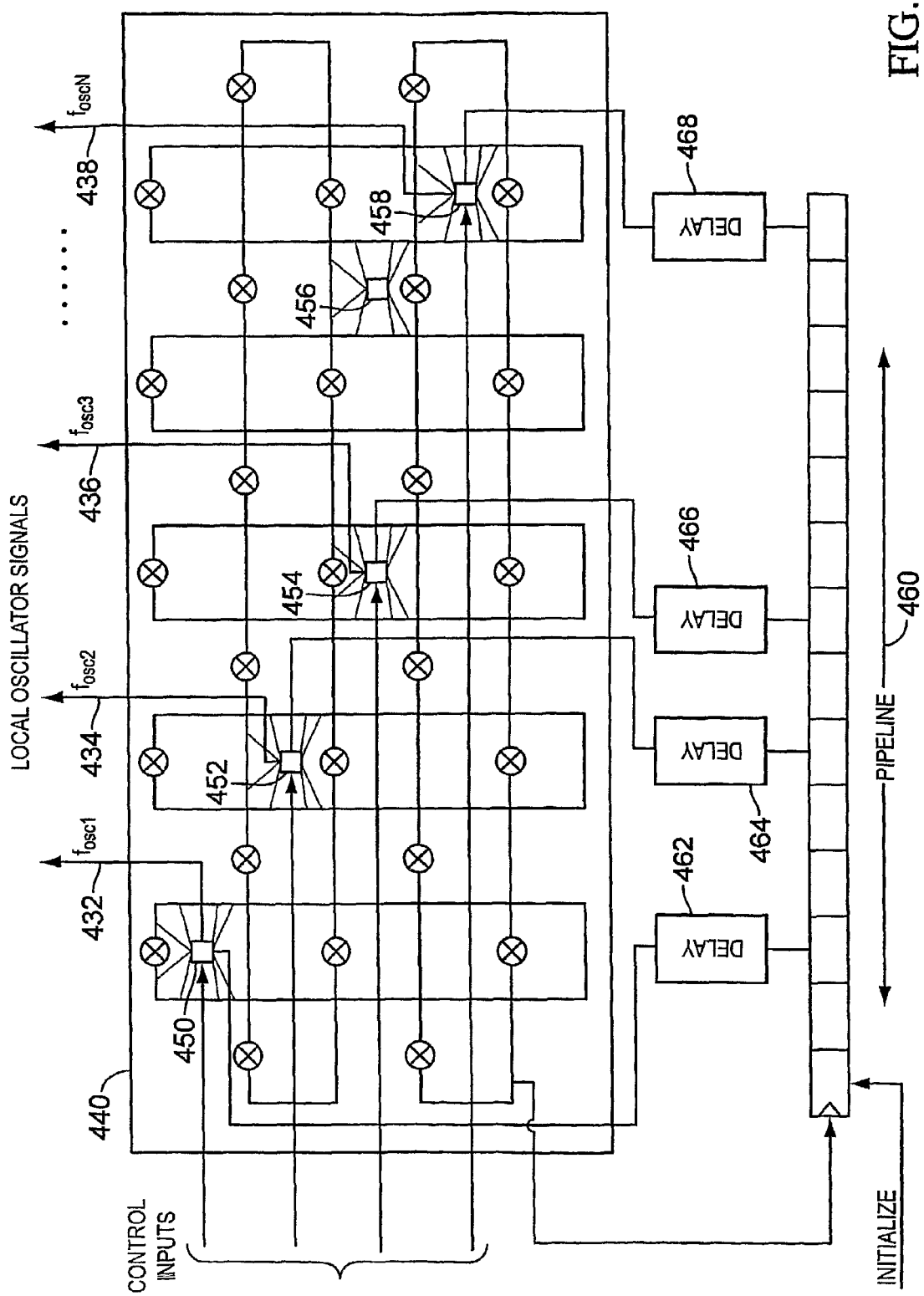
Figure 17C:
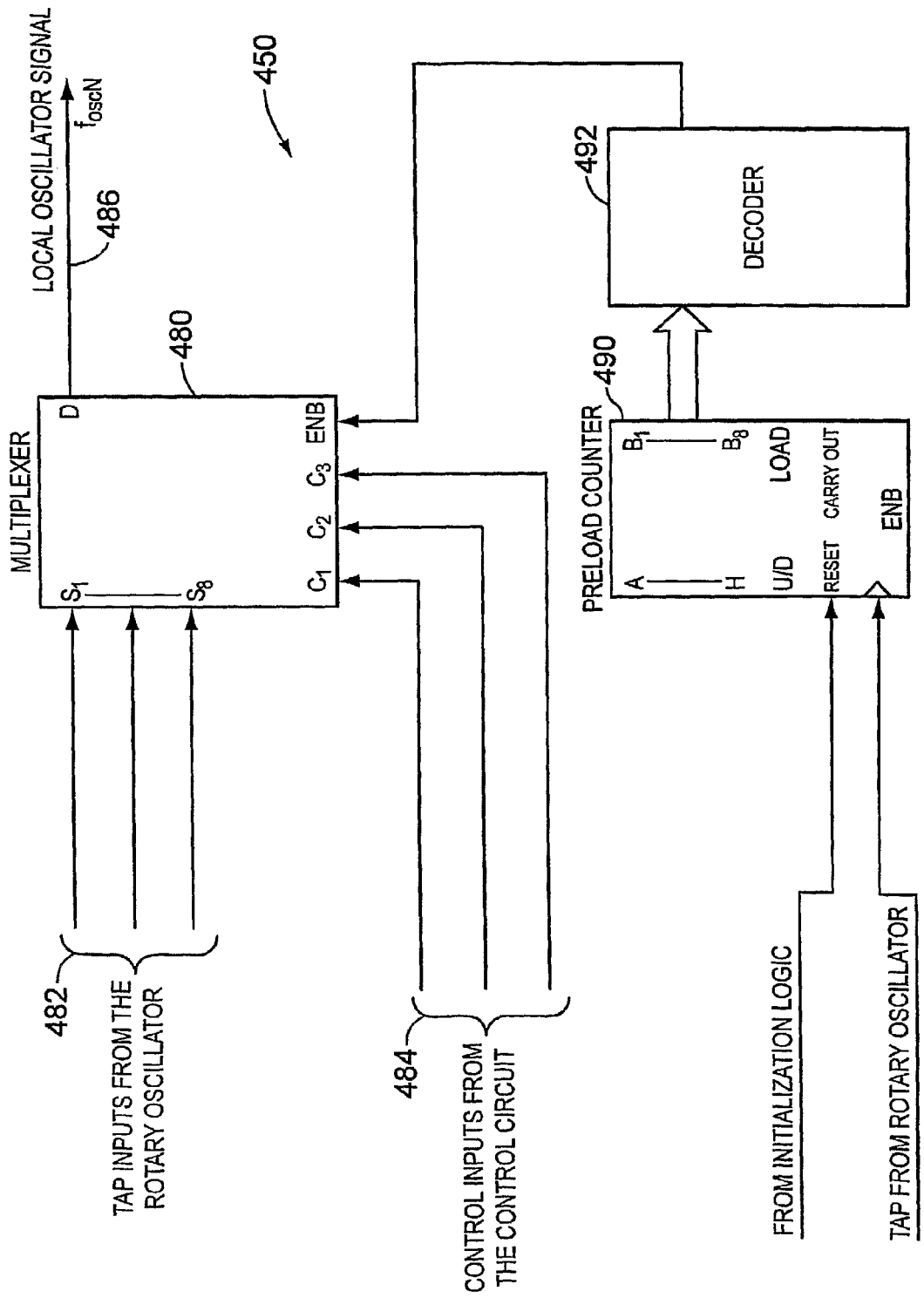

FIGS. 17A-C show a phased array antenna system. FIG. 17A shows a system 400 that includes a number of antenna elements 120-126 and an up/down converters 402-408 for each element. Each up-converter receives the signal 420-426 to be transmitted and each down converter produces a signal 420-426 to be combined in the signal combination/distribution network 420. Each up/down converter also receives a local oscillator 430-436 derived from the rotary oscillator array 440, which is controlled by a control unit 442. Referring to FIG. 17B, the rotary oscillator array 440 includes a plurality of rotary traveling wave oscillators interconnected so as to injection lock an oscillator with its neighbors. Proximate to one or more of the oscillators is phase shifter circuitry 450-458. This circuitry receives inputs from the control unit to select one of many phases available from the proximate rotary oscillator. The selected phase is then output as the local oscillator to the converter. Optionally, a pipeline 460 and one or more delay circuits 462-468 may be present. The pipeline causes a RESET or similar signal to propagate down a total number of clocked stages, where the number of stages is related to the time it takes to propagate a signal over a dimension of the array. The delay circuits then delay the RESET signal an amount depending on the stage being delayed and drive a reset signal on any cycle counter present in the phase shifter circuitry. The amount of delay in one version is equal to the total number of the stages of the pipeline less the stage number to which the delay circuit is attached, with the intended result is that each reset signal arriving at a cycle counter is delayed by the same number of clocks.

FIG. 17C shows the details of the phase shifter in one embodiment. Included are a multiplexer 480 that receives the taps 482 from the proximate rotary oscillator and based on the inputs 484 from the control circuitry selects one of the phases for output as the local oscillator 486. Optionally, included in the phase shifter is a cycle counter circuit 490 and decoder 492 that is operative, based on control information from the control unit, to enable the local oscillator signal to be output for one or more cycle counts of the counter 492.

Architecture

Figure 18:
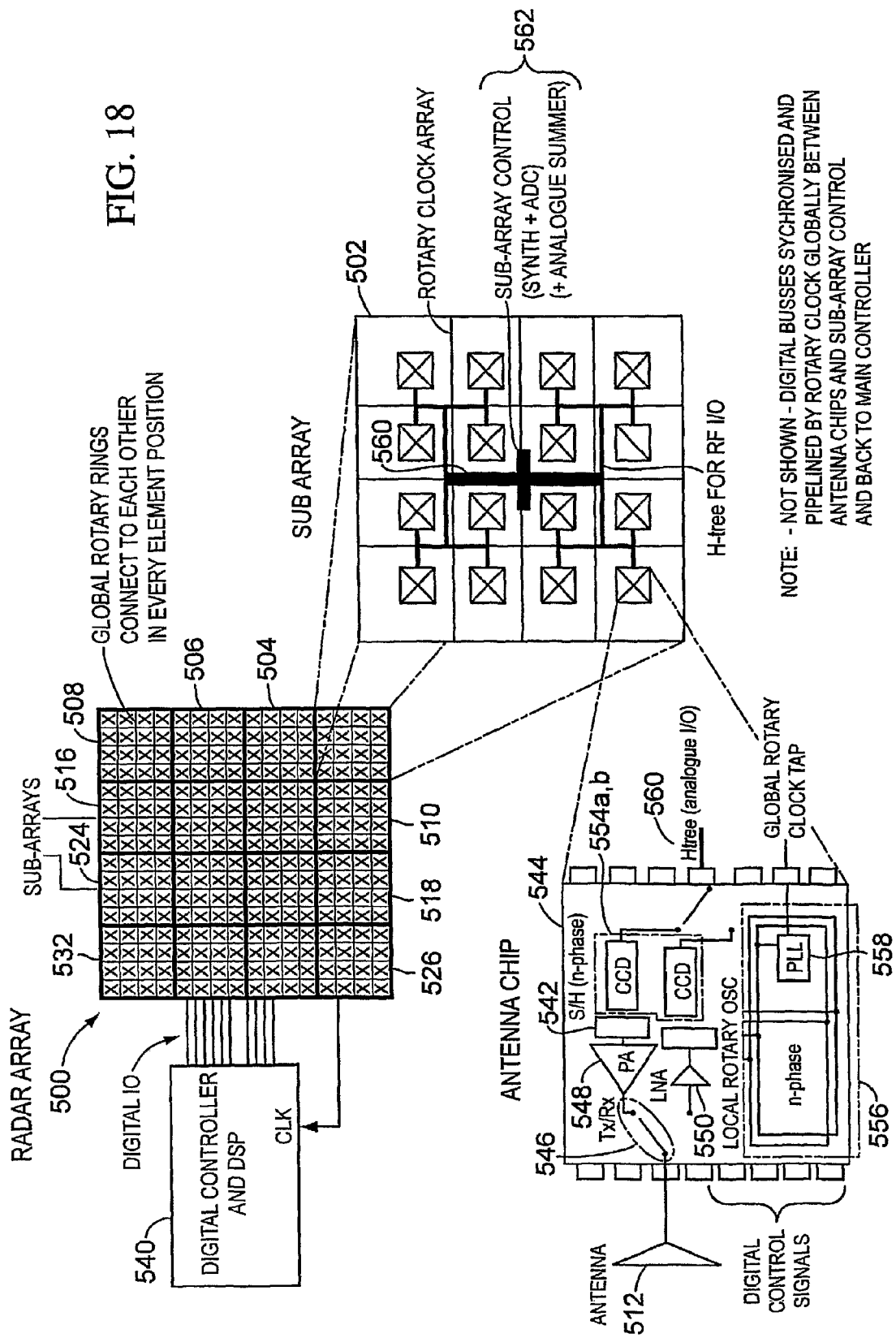
FIG. 18 shows an example architecture has 256 elements arranged as 16 (4×4) sub-arrays of 16 elements (4×4) each.

The hierarchy contemplated herein includes digital control electronics such as a computer, multiple sub-arrays containing X·Y antenna with digital interfaces, and a plurality of antenna elements each with mixed-signal digital and analog interface to each other. FIG. 18 shows an example architecture that includes a main array 500 having sixteen subarrays 502-532. The main array 500 has an associated digital controller 540, such as a computer, that provides digital I/O for the main array and subarrays and a global array of rotary clocks. Each subarray includes, in the example, sixteen antenna elements and each antenna element 542 has an associated antenna IC 544. The antenna IC is shown as including a transmit/receive switch 546, a power amplifier 548 for driving the antenna element, a LNA 550 for receiving signals from the antenna element, sample and hold circuitry 552 for the transmit path and the receive path, analog delay lines (CCDs 554, in this embodiment) in the transmit and receive paths, a local multiphase oscillator 556 such as a rotary oscillator and a phase locked loop 558. The subarray 502 has access to the global rotary clock array that maintains the local multiphase oscillator in phase lock and an H-tree 560 that is used to combine or distribute the RF signals. A sub-array architecture is assumed here and may be preferable for modularity and cost savings, but there is nothing to preclude the sub-array being 1×1 element when future device cost savings permit.

Signaling

It is contemplated that the transmit signal is synthesized digitally at the sub-array level (one synthesizer per sub-array) and also that the receive signals are summed in the analog domain at the sub-array level before being digitized (one ADC per sub-array). This compromise saves cost and weight and helps dynamic range. It doesn't impact the flexibility of the true-time-delay mechanism that is to be implemented on a per-antenna basis at the antenna integrated circuit.

All global signaling is to be digital and maintained by cooperating state machines timed from a global X/Y array of Rotary clocks, say at the board level, which are interlinked within and between the sub-arrays. This provides a global reference of time, i.e., cycle count and phase, across the whole array down to the element-level and a method of pipelining for issuing and receiving digital data synchronously to/from all points in the array beyond the usual limits imposed by time-of-flight restrictions.

Rotary Clocks

Rotary traveling wave oscillators, which inherently provide 360° of phase, can be combined with digital state machines to provide a source of true-time at arbitrary resolution. Rotary traveling wave oscillators are described in U.S. Pat. Nos. 6,556,089, 6,816,020, and 6,525,618, all of which are incorporated by reference into the present application. Synthesizing arbitrary frequencies using a rotary oscillator is described in U.S. patent application Ser. No. 11/121,161, filed May 2, 2005, titled "Frequency Synthesizer", and therefore the exact frequencies of the rotary oscillators need not be related a priori to the intended radar operating frequencies.

Multiphase oscillators such as rotary oscillators are used as a global phase-lock mechanism (PCB level) and within ICs as true-time delay references for driving CCDs, sample and hold devices and digital state machines.

Digital Control/Signal Processing Computer

This computer 540 is responsible for (i) uploading the frequency synthesis patterns to the sub-arrays, (ii) uploading in real-time the true-time-delays for each antenna element to steer the beam and control nulls, and (iii) downloading in real-time the digital responses from the sub-arrays and possibly summing the digital codes and performing extra signal processing in the digital domain.

Sub-Array

The Sub-array 502 contains X*Y array of antenna elements and a frequency synthesis chip (containing Table lookup and DAC or real-time synthesis). This chip is synchronously controlled by a bus from the Digital controller. The subarray includes transmission-line H-tree(s) 560, TX/RX switches, an analog summer 562, and an ADC 562.

There can be either two transmission line H-trees, each dedicated to the transmit and receive paths, or just one that is multiplexed for transmit and receive. The H-trees are used for distribution of the synthesized waveform in the analog domain and for combining the results of antenna element. The precision of the H-tree is not too important because each antenna element has a programmable true-time offset, which is discussed below.

The TX/RX switches may be required for sharing a single signal-distribution H-tree.

The analog summer is used to combine in the analog domain the signals from each of the antenna elements.

The ADC has a wide dynamic range ADC. This ADC is clocked from a source derived from the global rotary clocks.

Sub-arrays are used in this design and implement some of the local processing in the analog domain for reasons of signal noise and cost.

Antenna IC (AIC) and Controls

Each of the antenna element(s) has control electronics, possibly a single chip, that includes the following elements or functions: TX Power Amplifier (PA) 548; RX Low-Noise amplifier (LNA) 550; TX/RX antenna switch 546; various sample/hold 552 or mixer functions; true time-delay analog signal delay element 554a,b (only for sub-array implementation); an ADC (only for non sub-array implementation); and synchronized multiphase oscillator arrays such rotary oscillator arrays 556. There are at least two alternatives here. Either the input waveform can be digitized using a Sample and Hold 552 right at the output of the LNA 550, after which the data is delayed digitally before digital summation, or using an analog delay line 554a,b, the digitization can be deferred to the sub-array level where summing can take place. Tradeoffs are in terms of power/cost/complexity/dynamic range.

Mixing Vs. Sample/Hold

RF designers think in terms of Carriers, IF, Mixers, Up-Converters. Today there is a blurring of boundries. For example it is possible to buy RF down-converting analog to digital converters (ADCs). These devices don't perform mixing as such, but through the process of under-sampling, achieve the same result. It can be seen than a sample/hold is a multiplier with either 0 or 1 as the multiplier. The equivalence between mixing and sampling (or gating) is not related to the analog to digital conversion process.

Sampling

High frequency rotary clocks fabricated on the antenna integrated circuit drive track-hold or sample-hold circuits to capture the RF radar-echo signal coming back from the LNA. It is possible to use interleaved sampling using multiple parallel samplers each driven from a different clock phase to achieve higher effective sampling rate than that implied by the rotary clock frequency alone. Since all the rotary-clocks within the entire system are phase and frequency locked, digital control of a phase-multiplex at each sampler gives independent selection of true-time at which each element captures the signal. This provides a fine-grain delay mechanism. Depending on the effective sample-rate of the RF sampler, we can have either Nyquist (F×2) sampling, oversampling (>F/2) or undersampling (down conversion) (<F/2).

Rotary Oscillators on-Chip/PLL

It is anticipated that local Rotary oscillators are phase locked to the global PCB level rotary oscillator array using a frequency multiplying PLL. The local or on-chip rotary oscillators have good close-in phase noise by virtue of being synchronized to a large array.

CCDs

To implement true-time-delay greater than a fraction of a rotary clock period (i.e., multiple cycles of rotary clock period) a CCD 554a,b or bucket-brigade analog delay line is ideal. Charge-coupled devices are an ideal method of analog signal delay. Once an analog signal is in the charge-domain signal transfer is up to 99.999% efficient per stage. Additionally, because the charge transport is in a depleted (insulator) medium there is no thermal noise associated with the process. Using CCDs delays up to 20 clock cycles with better than 0.5 dB of loss are practical.

In the past, the complex clocking requirements and the power consumption of the multiphase clocks have inhibited use of CCD delay lines to the point where most CCD imager chips use 1μ feature size and above. Recently CCDs have been fabricated on 0.18 u SOI CMOS and a 99.99% charge transfer efficiency per stage at 70 pS is reported. This is a direct result of the short channel length. Combining such technology with rotary clock multiphase clocking [see figure] makes a viable low-power system for radar frequencies.

The CCDs are used in both transmit and receive to program the coarse part of the true time delay. By multiplexing the input or the output tap points of the CCD line through digital mux selection, it is possible to delay a precision analog signal by integer number of rotary clock cycles (or sub-cycle for multiphase CCD).

On RX, the captured signal from the S/H is further delayed by N cycles so that the final summation of multiple RX antenna signals is time-aligned to the incident wavefront arriving from the chosen operation angle.

On TX another CCD 554b is used to delay the synthesized signal (which arrives at each element at more-or-less the same time) by a programmable number of rotary clock cycles again corresponding to the coarse part of a true time delay. The TX CCD is followed by a master/slave S/H driven by a programmable phase mux to select the correct rotary clock phase for the fine-delay.

Note that it can be quite difficult to cover 360 degrees of phase selection on the S/H circuits and still meet timing for the CCD input/output. It is proposed that a ¼ phase tap selection of CCD tap point be used and the input and output of the CCDs to match the S/H.

Power Amp

Power amplifier 548 of modest output can be integrated on a CMOS chip or else an external HEMT amplifier can be used. SOI circuits, in particular, offer the possibility of combining power amplifiers with low coupling to other circuits on chip. In the Radar application TX and RX paths do not run simultaneously.

LNA

Deep-sub micron CMOS make reasonable LNA but external LNA is also possible.

TX/RX Antenna Switch

For integration only SOI CMOS supports decent low-loss switches 546. If practical, integrating this function on an IC would be a considerable advantage over using ferrite circulators.

Example Timing of Phase Array System

Figure 19:
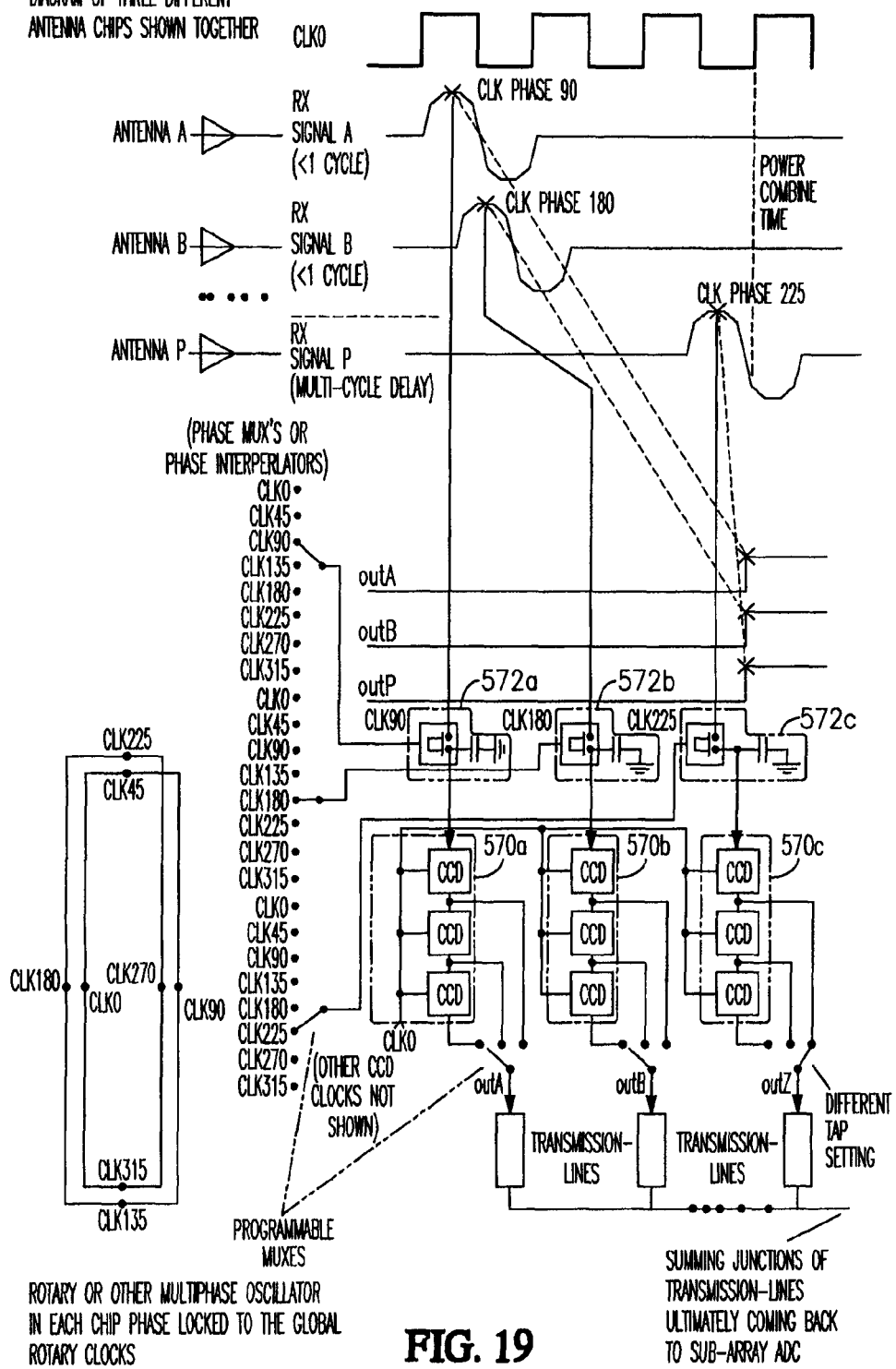
FIG. 19 shows an exploded circuit diagram of three Antenna switches chosen from an X/Y array and is shown flat as one circuit (in practice there any many individual chips physically separated and the diagram would be hierarchical).

FIG. 19 shows an exploded circuit diagram of three antenna switches chosen from an X/Y array and is shown flat as one circuit. (In practice, there many individual chips physically separated and the diagram would be hierarchical). The Receive path is shown but the TX is similar in principle with all the signal directions reversed (through muxing).

Figure 20:
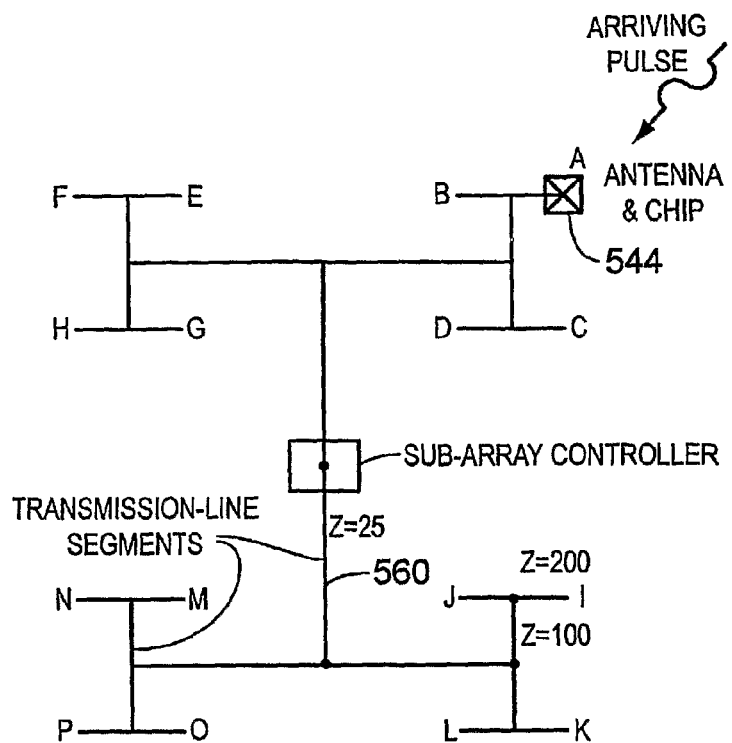
FIG. 20 depicts the topology of the example array of 16 elements shown with a single-pulse radar echo arriving from the northeast of the array.

FIG. 20 depicts the topology of the example array of 16 elements shown with a single-pulse radar echo arriving from north-east of the array. Antenna integrated circuit A receives the signal first, element B receives the signal a short time later. Element P receives the pulse at an even later time.

FIG. 19 has a timing diagram showing the phase-select settings for the S/H and the CCD tap settings that achieve the correct true-time power combination. A combination of S/H selectable phase and a pipelined CCD storage element 570a,b,c with selectable taps gives the equivalent of a programmable delay line for analog signals. Waveforms are shown as outA . . . outP for the single-pulse case. For other signal forms, since the signal paths are fully pipelined, results are output at every clock edge. Note that all clocks in the systems are synchronous with each other (linked by global rotary clock grid) and therefore it is reasonable to assume that power is combined synchronously at time shown in the timing diagram at each cycle.

Illustrated is the case of a single-sample per radar pulse, sampled at the radar carrier frequency (rotary f=radar pulse f). Oversampling can be achieved either by running the on-chip rotary clocks at frequencies higher than the radar frequencies, or, by having multiple parallel signal paths each operating on a different sample-hold clock phase, with multiple CCD paths and the necessary output multiphase re-multiplexing of the parallel channels to build a multi-step output.

Undersampling is also possible and represents a down-conversion of the RF signal which would, in that case, be fairly narrowband.

Power combination is a natural side-effect of the impedance of the binary-impedance signal H-tree 560 (See FIG. 20, Z=200, Z=100, Z=50, Z=25 etc). At the sub-array controller, an ADC can convert the time-delayed, power-combined signals to the digital domain. Signal-noise ratio is improved by the power-combination process and the ADC has a larger signal to work with than the case in which an ADC is positioned at each antenna element.

For TX mode, the signal H-tree 560 works as a power divider/splitter. The H-tree feature can be extended to greater depths (and more elements) providing that amplification and impedance transformation is used to mitigate need for unrealistic transmission-line impedances.

CCD Ideas

Figure 21A:
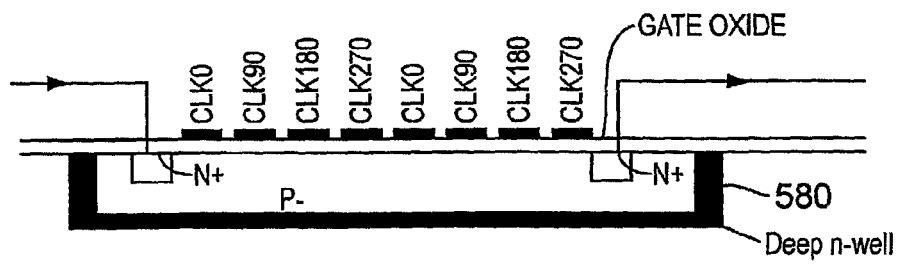
FIGS. 21A and 21B show a simplified surface-channel CCD structure compatible with CMOS processing.
Figure 21B:
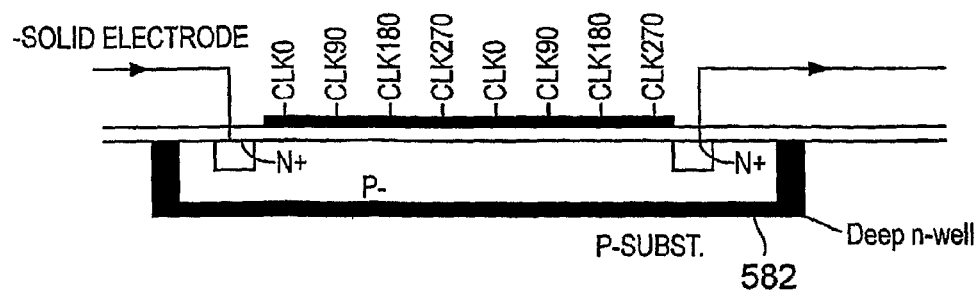

A simplified surface-channel CCD structure 580 compatible with CMOS processing is shown in FIGS. 21A and 21B. A four-phase clock (rotary clock taps) provides the stimulus to move charge down the channel below the gates. A problem encountered with forming CCDs on non-CCD process is the possibility of creating non-monotonic fields in the CCD channel because of the non-zero gaps between gate electrodes (which are typically polysilicon). At the expense of power, this problem can be solved by using a continuous (non-segmented) electrode tapped CCD 582 with metal contacts at many points by the clocks (or buffered versions of the clocks) and taking the penalty of power caused by current flowing in the (possibly unsalicided or high-resistance) polysilicon which is acting as a resistive-divider—see FIG. 21B.

Sub-Array Controller

Figure 22:
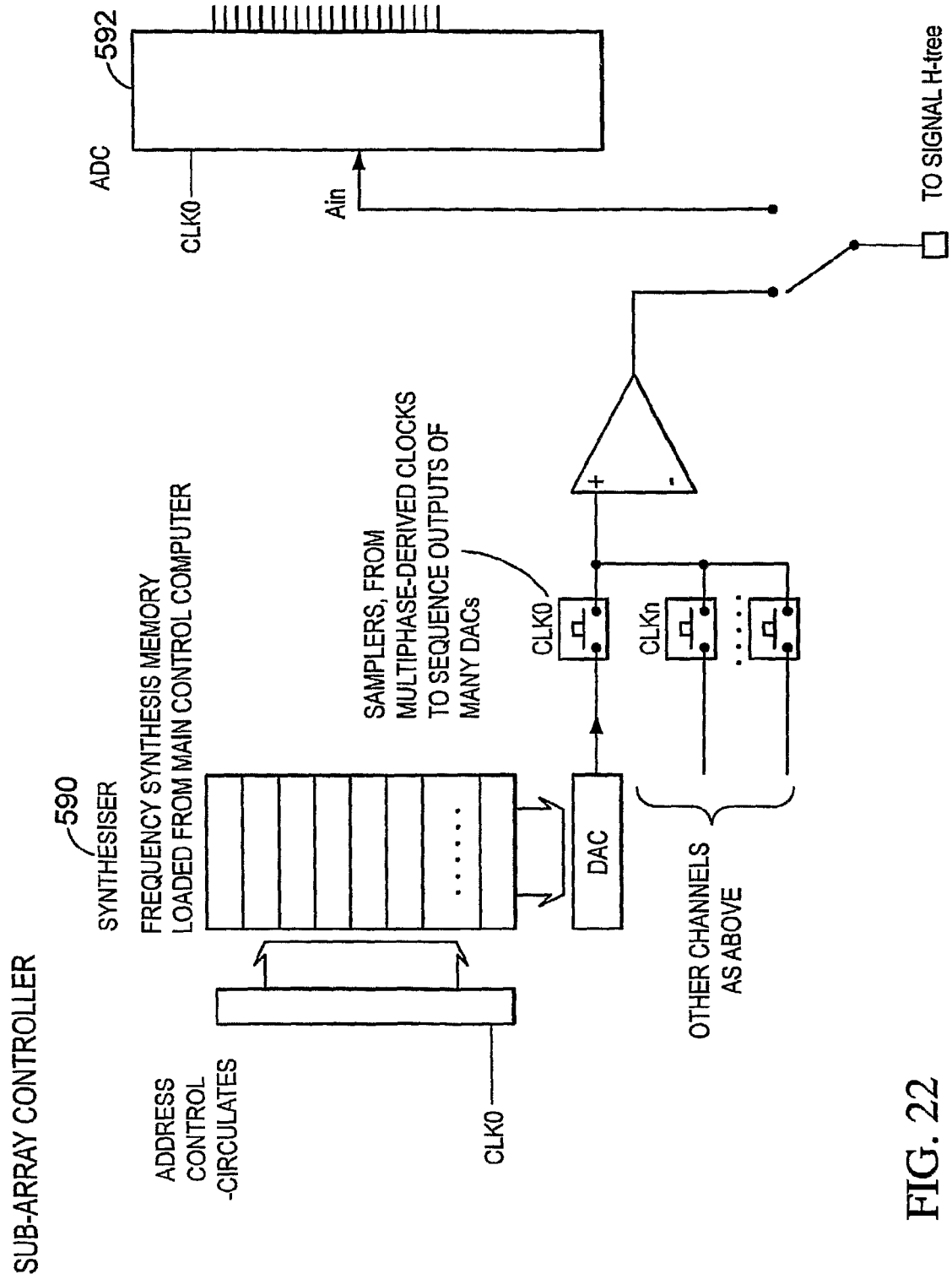
FIG. 22 shows an embodiment of a subarray controller.

FIG. 22 shows an embodiment of a sub-array controller. The controller includes a DAC-based frequency synthesizer 590, a high dynamic range, fast ADC 592, and rotary clocks. This chip or module is synchronized to the global rotary oscillator grid and uses on-chip clocks that may be multiplied from this global clock.

F-Synthesizer

An arbitrary signal generator produces the radar output pulse for the sub-array. One embodiment shown is to parallel many slower speed memory and DAC channels and to multiphase-multiplex to create waveforms with many steps per radar cycle. On TX, this waveform is fed to the individual antenna integrated circuits through the H-tree and the individual antenna integrated circuits can true-time-delay these signals using the CCD and for fine-phase tuning make use of a multiphase-selection sample-hold before feeding the power amplifier.

Other options include synthesizing lower-frequency waveforms and using the antenna integrated circuits to up-convert with the local carrier (the on-chip multiplied rotary oscillator frequency) to create the output radar signals.

ADC

The ADC 592 converts the power-combined signals at the root of the H-tree to the digital domain.

I/O

Digital I/O circuitry that is clocked by rotary oscillators and most likely pipelined passes the TX and RX signals to the central digital computer/DSP. For these long-range signal transmission digital is obviously advantageous.

Although the present invention has been described in considerable detail with reference to certain preferred versions thereof, other versions are possible. Therefore, the spirit and scope of the appended claims should not be limited to the description of the preferred versions contained herein.

What is claimed is:

1. A phased array antenna system comprising:
    a plurality of antenna elements arranged in a pattern and configured to receive radio-frequency signals;
    a plurality of down-converters each connected to one of the antenna elements to receive the radio-frequency signal captured by the antenna element, each down converter operative to down-convert the received radio-frequency signal using a local oscillator signal having a selected phase;
    a signal combining network configured to combine the down-converted signals generated by the down-converters to produce an output signal;
    a rotary oscillator array configured to provide local oscillator signals each with a selected phase to each of the down-converters based on control information; and
    a control unit configured to provide the control information to the rotary oscillator array to obtain the phase-shifted local oscillator signals,
    wherein the rotary oscillator array comprises a plurality of rotary travelling wave oscillators, a rotary travelling wave oscillator comprising:
        a differential transmission line in a closed loop, the differential transmission line including an odd number of one or more crossovers configured to reverse the polarity of a wave propagating through the differential transmission line; and
        a plurality of regenerative devices electrically connected along a path of the differential transmission line.

2. A phased array antenna system as recited in claim 1, wherein the plurality of rotary traveling wave oscillators are coupled so as to make the oscillators coherent; and wherein the rotary oscillator array further includes:
    a plurality of phase shifters each providing a local oscillator signal with a selected phase to one of the down converters, each phase shifter being located proximate to one of the rotary oscillators and being connected to a plurality of phase taps of the proximate oscillator, each phase shifter receiving control information from the control unit to select one of the phase taps for output as the local oscillator signal.

3. A phased array antenna system as recited in claim 2, wherein the oscillators are made coherent by injection locking.

4. A phased array antenna system as recited in claim 2, wherein each phase shifter further includes a cycle counter configured to count clock cycles of the proximate oscillator;
    wherein the control unit includes synchronization logic configured to initialize the cycle counters simultaneously and to provide control information configured to control the use of the cycle counters by the phase shifters; and
    wherein the phase shifter selects one of the phase taps as the local oscillator signal based on the cycle counter and cycle count control information from the control unit so as to provide the local oscillator signal at the selected phase for one or more counts of the cycle counter.

5. A phased array antenna system as recited in claim 4, wherein the synchronization logic includes:
    a pipeline having a total number of stages, each stage providing a signal configured to initialize one of the counters, the total number of stages being approximately equal to the number of oscillator clocks needed to propagate a signal over the area spanned by the rotary oscillators; and
    a plurality of delay circuits, each delay circuit connected between a pipeline stage and a counter and providing a delay in oscillator clocks of the initialization signal at the stage to which the delay circuit is connected, the delay being the difference between the total number of stages and the number of the delay stage at which the delay circuit is connected.

6. A phased array antenna system comprising:
    a plurality of antenna elements arranged in a pattern and configured to send radio-frequency signals;
    a plurality of up-converters, each connected to one of the antenna elements to send a radio-frequency signal, each up-converter operative to up-convert the an input signal to a radio-frequency signal using a local oscillator signal having a selected phase;
    a signal distribution network configured to distribute the input signals to the up-converters;
    a rotary oscillator array configured to provide local oscillator signals each with a selected phase to each of the up-converters based on control information; and
    a control unit configured to provide control information to the rotary oscillator array to obtain the phase-shifted local oscillator signals,
    wherein the rotary oscillator array comprises a plurality of rotary travelling wave oscillators, a rotary travelling wave oscillator comprising:

a differential transmission line in a closed loop, the differential transmission line including an odd number of one or more crossovers configured to reverse the polarity of a wave propagating through the differential transmission line; and a plurality of regenerative devices electrically connected along a path of the differential transmission line.

7. A phased array antenna system as recited in claim 6, wherein the plurality of rotary traveling wave oscillators are coupled so as to make the oscillators coherent; and wherein the rotary oscillator array further includes:

a plurality of phase shifters each providing a local oscillator signal with a selected phase to one of the up-converters, each phase shifter being located proximate to one of the rotary oscillators and being connected to a plurality of phase taps of the proximate oscillator, each phase shifter receiving control information from the control unit to select one of the phase taps for output as the local oscillator signal.

8. A phased array antenna system as recited in claim 7, wherein the oscillators are made coherent by injection locking.

9. A phased array antenna system as recited in claim 7, wherein each phase shifter further includes a cycle counter configured to count clock cycles of the proximate oscillator;

wherein the control unit includes synchronization logic configured to initialize the cycle counters simultaneously and to provide control information configured to control the use of the cycle counters by the phase shifters; and wherein the phase shifter selects one of the phase taps as the local oscillator signal based on the cycle counter and cycle count control information from the control unit so as to provide the local oscillator signal at the selected phase for one or more counts of the cycle counter.

10. A phased array antenna system as recited in claim 9, wherein the synchronization logic includes:

a pipeline having a total number of stages, each stage providing a signal configured to initialize one of the counters, the total number of stages being approximately equal to the number of oscillator clocks needed to propagate a signal over the area spanned by the rotary oscillators; and a plurality of delay circuits, each delay circuit connected between a pipeline stage and a counter and providing a delay in oscillator clocks of the initialization signal at the stage to which the delay circuit is connected, the delay being the difference between the total number of stages and the number of the delay stage at which the delay circuit is connected.

11. A phased array antenna system comprising:
a plurality of antenna elements;
a plurality of transceiver blocks, each connected to one of the antenna elements and to an rf port, each transceiver block including a transmit path through which a signal to be transmitted travels to the connected antenna element, the transmit path including a true time delay of the signal to be transmitted, a receive path through which a received signal travels from the connected antenna element,
the receive path including a true time delay of the signal received, a rotary traveling wave oscillator configured to generate timing signals for the transmit and receive paths, and a pair of switches configured to selectably couple either the transmit path or the receive path between the rf port and the connected antenna element, wherein the rotary travelling wave oscillator comprises:
a differential transmission line in a closed loop, the differential transmission line including an odd number of one or more crossovers configured to reverse the polarity of a wave propagating through the differential transmission line; and a plurality of regenerative devices electrically connected along a path of the differential transmission line;

a distribution and collection network connected to the transceiver block, wherein the distribution and collection network is configured to distribute the rf signals to be transmitted and to collect the rf signals received; and a controller configured to provide digital control signals to the transceiver blocks.

12. The phase array antenna system of claim 11, wherein the plurality of transceiver blocks are arranged in a plurality of subarrays and the plurality of subarrays are collected together to form a main array;

wherein the distribution and collection network includes, in each subarray, an H-tree that distributes and collects the rf signals; and wherein each subarray includes an array of synchronized multiphase oscillators, the array providing timing signals for the transceiver blocks.

13. The phase array antenna system of claim 12, wherein the array of synchronized multiphase oscillators is an array of rotary traveling wave oscillators.

14. The phase array antenna system of claim 12, wherein the H-tree includes a plurality of transmission lines arranged in an 'H'-like configuration and connected to each of the transceiver blocks in the subarray.

15. The phase array antenna system of claim 11, wherein the plurality of transceiver blocks are arranged in a plurality of subarrays and the plurality of subarrays are collected together to form a main array;

wherein the distribution and collection network includes, in each subarray,
a frequency synthesizer configured to waveform an rf signal and a D/A converter that converts the rf signal to an analog signal to be transmitted,
an A/D converter that converts the received rf signal to a digital signal on the distribution and collection network, and
a digital summer configured to combine the received rf digital signals; and wherein each subarray includes an array of synchronized multiphase oscillators, the array providing timing signals for the transceiver blocks.

16. The phase array antenna system of claim 15, wherein the array of synchronized multiphase oscillators is an array of rotary traveling wave oscillators.

17. The phase array antenna system of claim 11, wherein the transmit path includes:
an analog delay line configured to time delay an rf signal on the rf port in response to the timing signals from the rotary traveling wave oscillator,
a S/H circuit connected to the analog delay line and configured to add a fractional delay to the delayed rf signal in response to a timing signal from the rotary traveling wave oscillator, and
a power amplifier configured to boost the signal from the S/H circuit and to drive the antenna element.

18. The phase array antenna system of claim 17, wherein the analog delay line is a CCD having control inputs connected to the timing signals from the rotary traveling wave oscillator.

19. The phase array antenna system of claim 11, wherein the receive path includes:
- a low noise amplifier configured to boost the received signal,
- a S/H circuit connected to the low noise amplifier and configured to add a fractional delay to the received signal in response to a timing signal from the rotary traveling wave oscillator, and
- an analog delay line configured to time delay the signal from the S/H circuit in response to the timing signals from the rotary traveling wave oscillator.

20. The phase array antenna system of claim 19, wherein the analog delay line is a CCD having control inputs connected to the timing signals from the rotary traveling wave oscillator.

\* \* \* \* \*